US012387945B2

(12) United States Patent
Juang et al.

(10) Patent No.: US 12,387,945 B2
(45) Date of Patent: Aug. 12, 2025

(54) SEMICONDUCTOR STRUCTURES INCLUDING GLASS CORE LAYER AND METHODS OF FORMING THE SAME

(71) Applicant: Taiwan Semiconductor Manufacturing Company, Ltd., Hsinchu (TW)

(72) Inventors: Jing-Ye Juang, Hsinchu (TW); Hsien-Wei Chen, Hsinchu (TW); Shin-Puu Jeng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 552 days.

(21) Appl. No.: 17/838,294

(22) Filed: Jun. 13, 2022

(65) Prior Publication Data

US 2023/0411171 A1    Dec. 21, 2023

(51) Int. Cl.
*H01L 21/48*    (2006.01)
*H01L 23/00*    (2006.01)
*H01L 23/15*    (2006.01)
*H01L 23/498*    (2006.01)
*H01L 25/065*    (2023.01)
*H01L 25/16*    (2023.01)

(52) U.S. Cl.
CPC ........ *H01L 21/486* (2013.01); *H01L 21/4853* (2013.01); *H01L 21/4857* (2013.01); *H01L 23/15* (2013.01); *H01L 23/49816* (2013.01); *H01L 23/49822* (2013.01); *H01L 23/49838* (2013.01); *H01L 24/16* (2013.01); *H01L 24/32* (2013.01); *H01L 24/73* (2013.01); *H01L 25/0655* (2013.01); *H01L 25/16* (2013.01); *H01L 2224/16227* (2013.01); *H01L 2224/16237* (2013.01); *H01L 2224/32225* (2013.01); *H01L 2224/73204* (2013.01); *H01L 2924/19041* (2013.01); *H01L 2924/37001* (2013.01)

(58) Field of Classification Search
CPC .............. H01L 21/4857; H01L 21/486; H01L 2224/05188; H01L 23/14; H01L 23/15; H01L 23/49822; H01L 23/49833; H01L 23/49894; H01L 23/5383
See application file for complete search history.

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |

(Continued)

*Primary Examiner* — Nelson Garces
(74) *Attorney, Agent, or Firm* — JCIPRNET

(57) ABSTRACT

A method of forming a semiconductor structure includes the following operations. First deep vias are formed in a first glass layer. A first redistribution layer structure is formed on a first side of the first glass layer, and the first redistribution layer structure is electrically connected to the first deep vias. A carrier is bonded to the first redistribution layer structure. The first glass layer is grinded until surfaces of the first deep vias are exposed. A second redistribution layer structure is formed on a second side of the first glass layer opposite to the first side, and the second redistribution layer structure is electrically connected to the first deep vias.

20 Claims, 22 Drawing Sheets

(56) References Cited

U.S. PATENT DOCUMENTS

| | | | |
|---|---|---|---|
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 2013/0200516 A1* | 8/2013 | Nakatani | H05K 1/0306 |
| | | | 257/737 |
| 2022/0045016 A1* | 2/2022 | Jeng | H01L 21/4853 |

\* cited by examiner

SEMICONDUCTOR STRUCTURES INCLUDING GLASS CORE LAYER AND METHODS OF FORMING THE SAME

BACKGROUND

In recent years, the semiconductor industry has experienced rapid growth due to continuous improvement in integration density of various electronic components, e.g., transistors, diodes, resistors, capacitors, etc. For the most part, this improvement in integration density has come from successive reductions in minimum feature size, which allows more components to be integrated into a given area.

In some applications, integrated circuit components or semiconductor dies, one or more chip packages are generally bonded to a circuit board for electrical connections to other external devices or electronic components. Although the existing circuit board has been generally adequate for their intended purposes, it has not been entirely satisfactory in all respects.

DETAILED DESCRIPTION

Figure 1:
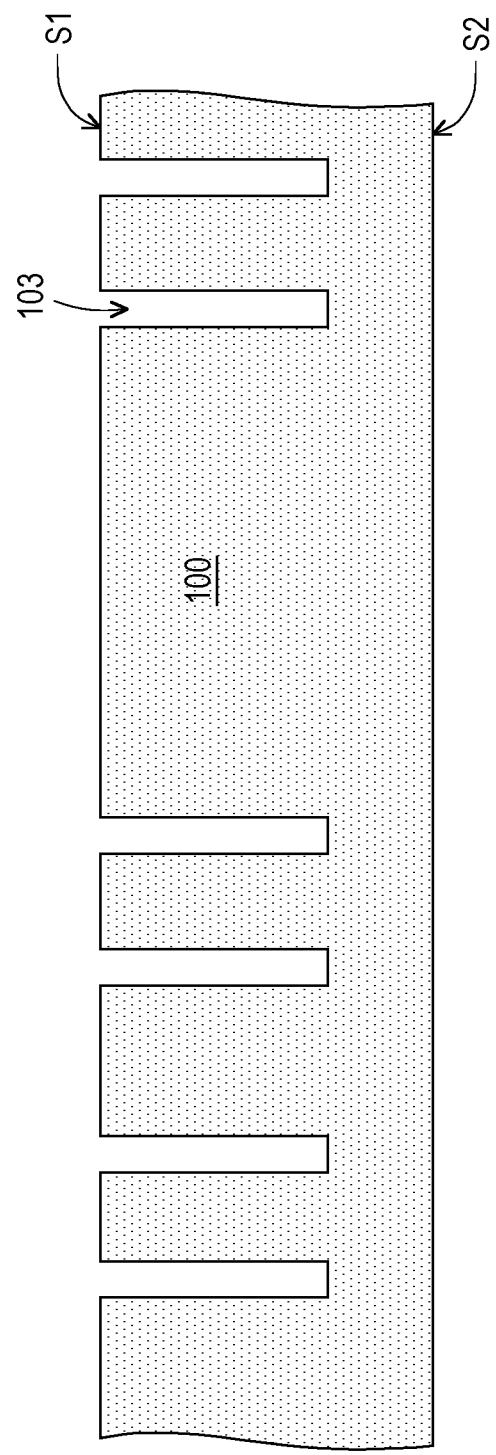
FIG. 1 to FIG. 15 are cross-sectional views schematically illustrating a method of forming a semiconductor structure in accordance with some embodiments of the present disclosure.

The following disclosure provides many different embodiments, or examples, for implementing different features of the provided subject matter. Specific examples of components and arrangements are described below for the purposes of conveying the present disclosure in a simplified manner. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the same reference numerals and/or letters may be used to refer to the same or similar parts in the various examples the present disclosure. The repeated use of the reference numerals is for the purpose of simplicity and clarity and does not in itself dictate a relationship between the various embodiments and/or configurations discussed.

Further, spatially relative terms, such as "beneath", "below", "lower", "on", "over", "above", "upper" and the like, may be used herein to facilitate the description of one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 to FIG. 15 are cross-sectional views schematically illustrating a method of forming a semiconductor structure in accordance with some embodiments of the present disclosure. It is understood that the disclosure is not limited by the method described below. Additional operations can be provided before, during, and/or after the method and some of the operations described below can be replaced or eliminated, for additional embodiments of the methods.

Although FIG. 1 to FIG. 15 are described in relation to a method, it is appreciated that the structures disclosed in FIG. 1 to FIG. 15 are not limited to such a method, but instead may stand alone as structures independent of the method.

Referring to FIG. 1, deep openings 103 are formed in an inorganic layer 100. In some embodiments, the inorganic layer includes a glass layer, a quartz layer, the like, or a combination thereof. In some embodiments, the inorganic layer 100 has a first side S1 and a second side S2 opposite to the first side S1. The inorganic layer 100 is referred to as an "inorganic core layer", "glass core layer", "glass layer", "glass carrier" or "glass support" in some examples. In some embodiments, the glass carrier is replaced by a quartz carrier. In some embodiments, glass is non-crystalline silica, while quartz is crystalline mineral composed of silica. In some embodiments, the hardness of the quartz carrier is higher than the hardness of the glass carrier, so as to robust the stiffness of subsequently formed semiconductor structure. In some embodiments, a patterning process (e.g., a laser drilling, an etching or the like) is performed to a first side S1 of the inorganic layer 100, so as to form the deep openings 103 in the inorganic layer 100. The deep openings 103 do not penetrate the inorganic layer 100 at the stage.

Figure 2:
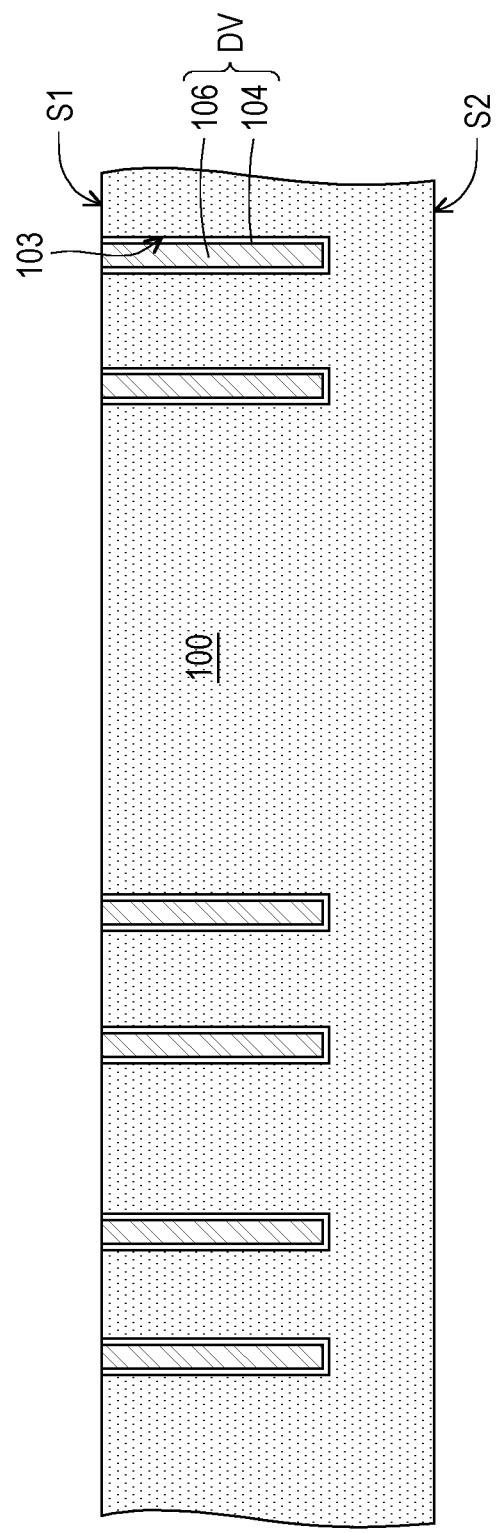

Referring to FIG. 2, a seed layer 104 is formed conformally on the first side S1 of the inorganic layer 100, covering the sidewalls and bottoms of the deep openings 103. In some embodiments, the seed layer 104 includes Cu, Ti, Ta, W, Ru, Co, Ni. Au or an alloy thereof, and is formed by a sputtering process or a suitable method. For example, the seed layer 104 includes Ti/Cu; that is, a lower Ti layer and an upper Cu layer.

Afterwards, a metal layer 106 is formed in the deep openings 103 of the inorganic layer 100. In some embodiments, the method of forming the metal layer 106 includes performing an electroplating process. In some embodiments, the metal layer 106 is plated in the deep openings 103 of the inorganic layer 100 by using the seed layer 104 as a seed. In some embodiments, the metal layer 106 includes Cu, Ti, Ta, W, Ru, Co, Ni. Au or an alloy thereof. For example, the metal layer 106 includes Cu.

A planarization process (e.g., grinding or polishing process) is then performed to remove portions of the seed layer 104 and the metal layer 106 outside of the deep openings 103. The remaining seed layer 104 and the metal layer 106 inside the deep openings 103 constitute deep vias DV.

Figure 3:
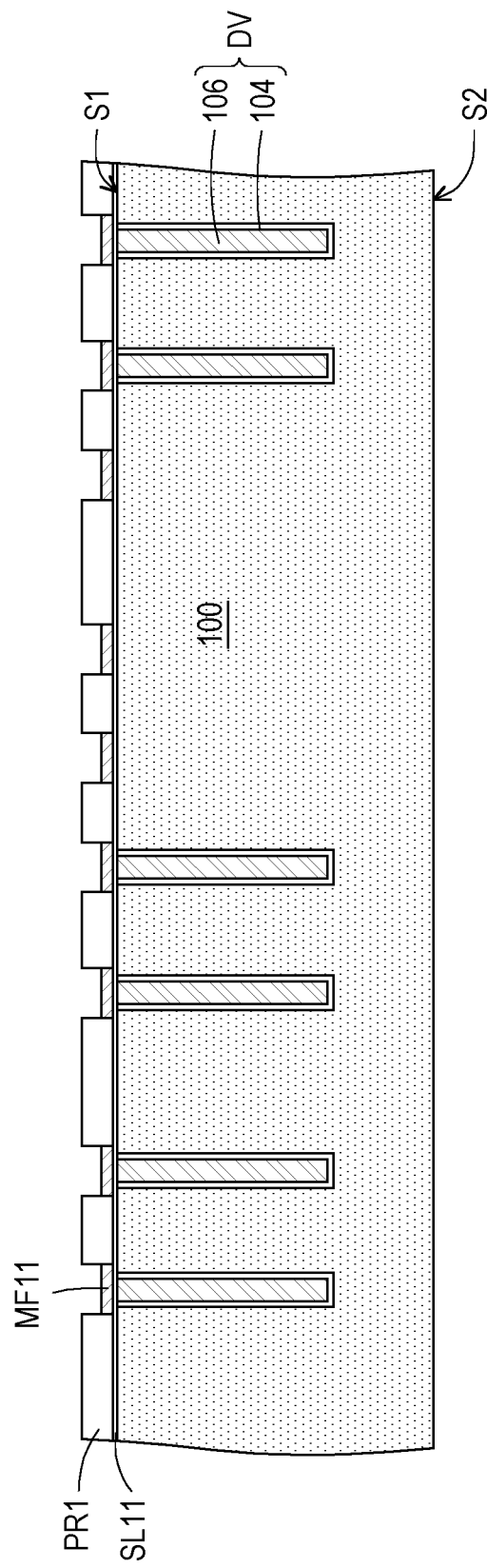

Referring to FIG. 3, a seed layer SL11 is formed on the first side S1 of the inorganic layer 100. In some embodiments, the seed layer SL11 is formed on the entire surface of the first side S1 of the inorganic layer 100 and in contact with the deep vias DV. In some embodiments, the seed layer SL11 is formed by a sputtering process or a suitable method. In some embodiments, the seed layer SL11 includes Cu, Ti, Ta, W, Ru, Co, Ni. Au or an alloy thereof. For example, the seed layer SL11 includes Ti/Cu; that is, a lower Ti layer and an upper Cu layer.

Thereafter, a photoresist layer PR1 is formed on the seed layer SL11. In some embodiments, the photoresist layer PR1 is a dry film resist (DFR) over the inorganic layer 100 and has openings that expose the intended locations for the subsequently formed metal features MF11. The openings of the photoresist layer PR1 expose portions of the seed layer SL11.

Afterwards, metal features MF11 are formed in the openings of the photoresist layer PR1. The metal features MF11 may be metal pads, metal lines or the like. In some embodiments, the method of forming the metal features MF11 includes performing an electroplating process. In some embodiments, the metal features MF11 are plated in the openings of the photoresist layer PR1 by using the seed layer SL11 as a seed. In some embodiments, the metal features MF11 include Cu, Ti, Ta, W, Ru, Co, Ni. Au or an alloy thereof. For example, the metal features MF11 include Cu.

Figure 4:
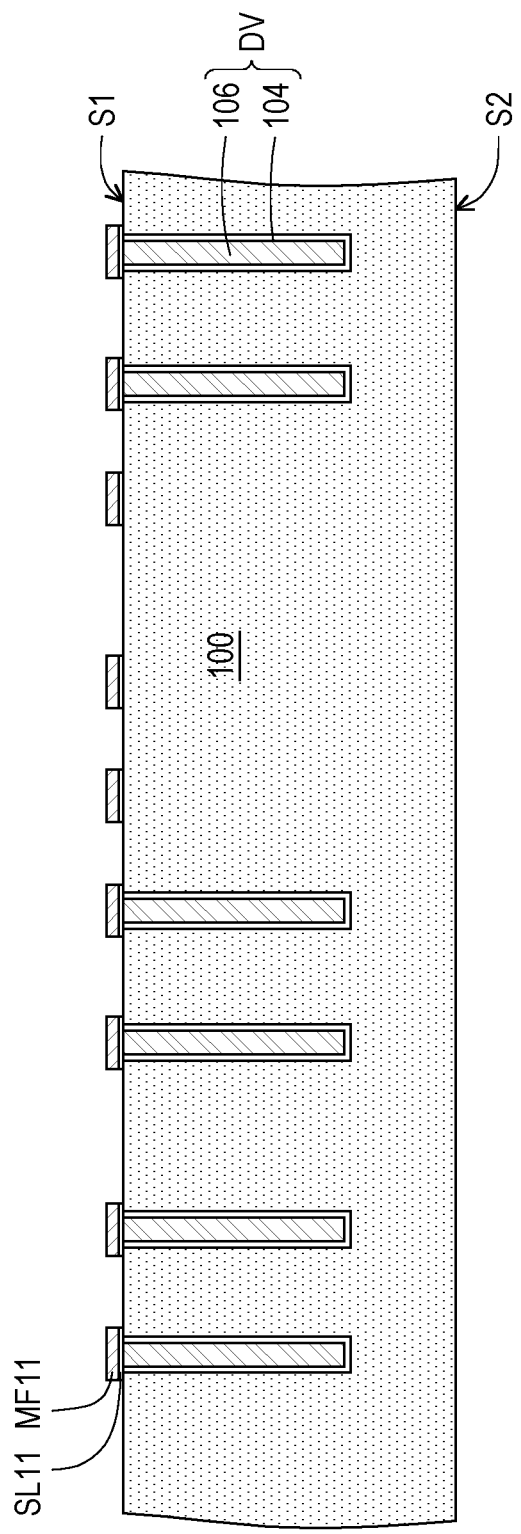

Referring to FIG. 4, the photoresist layer PR1 and the underlying seed layer SL11 are removed. In some embodiments, the photoresist layer PR1 is removed, and then the seed layer SL11 is partially removed by using the metal features MF11 as a mask. Therefore, the remaining seed layer SL11 is below each of the metal features MF11. In some embodiments, the edge of the seed layer SL11 is aligned with the edge of the corresponding metal feature MF11. In other embodiments, the edge of the seed layer SL11 is protruded out from the edge of the corresponding metal feature MF11.

Figure 5:
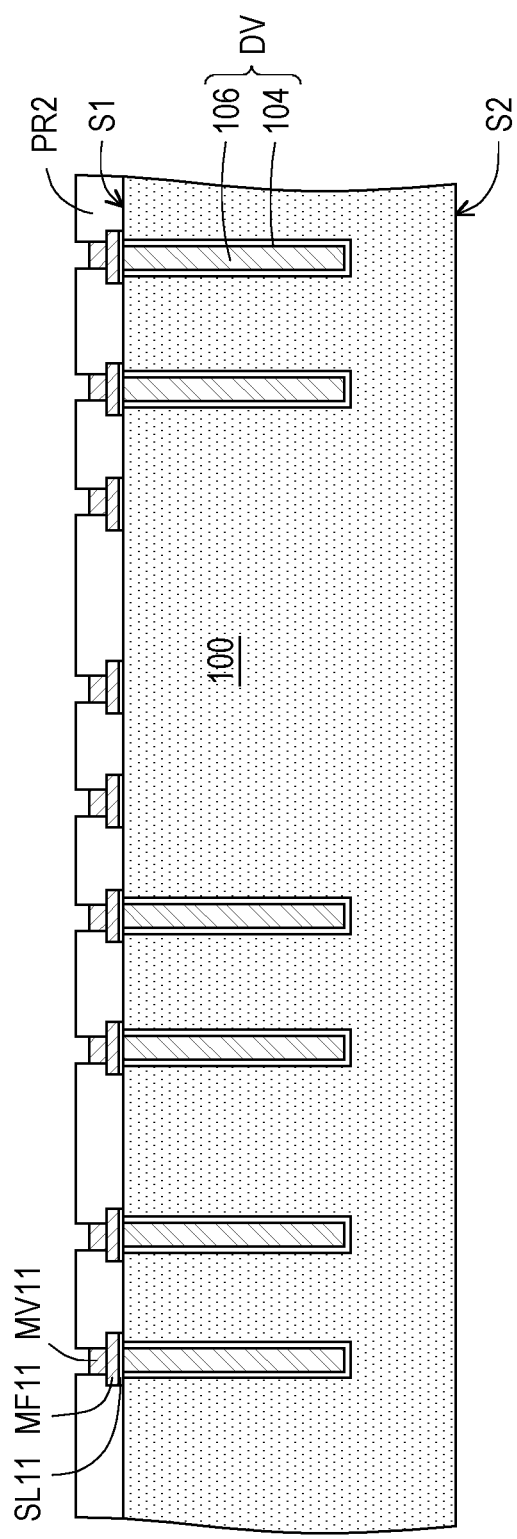

Referring to FIG. 5, a photoresist layer PR2 is formed on the first side S1 of the inorganic layer 100. In some embodiments, the photoresist layer PR2 is a dry film resist (DFR) over the inorganic layer 100 and has openings that expose the intended locations for the subsequently formed metal vias MV11. The openings of the photoresist layer PR2 expose portions of the metal features MF11.

Thereafter, the metal vias MV11 are formed in the openings of the photoresist layer PR2. In some embodiments, the method of forming the metal vias MV11 includes performing an electroplating process. In some embodiments, the metal vias MV11 are plated in the openings of the photoresist layer PR2 by using the metal features MF11 as a seed. In some embodiments, the metal vias MV11 include Cu, Ti, Ta, W, Ru, Co, Ni. Au or an alloy thereof. For example, the metal vias MV11 include Cu. The photoresist layer PR2 is then removed.

Figure 6:
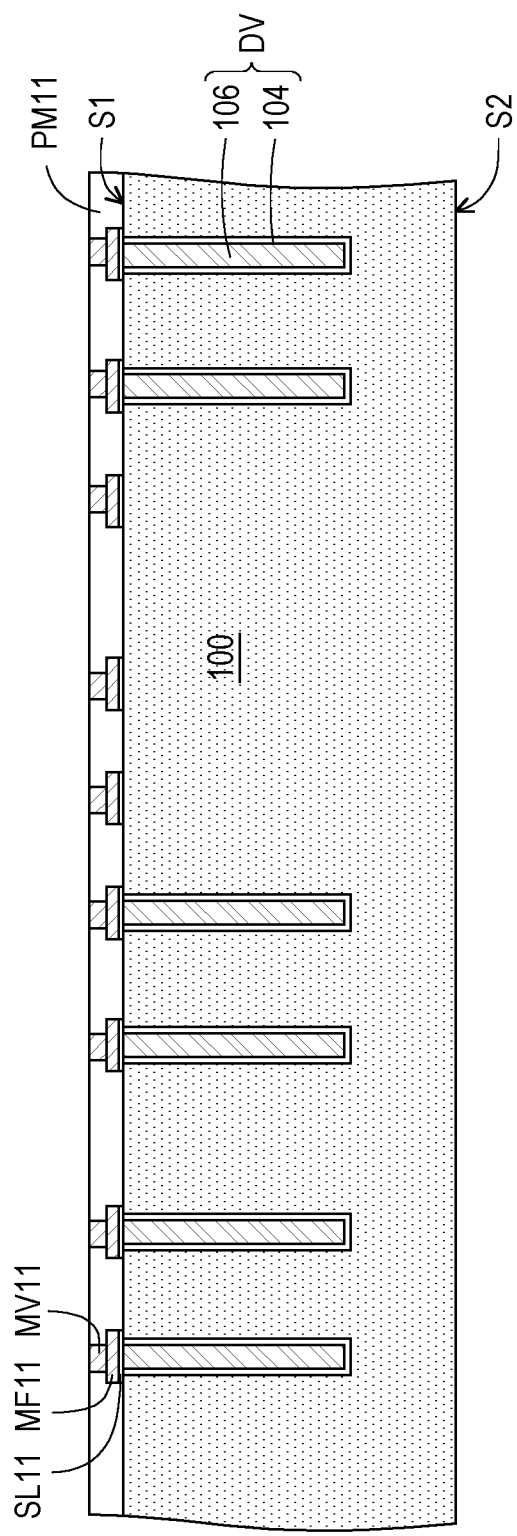

Referring to FIG. 6, a polymer layer PM11 is formed over the inorganic layer 100 and surrounds the sidewalls of the seed layers SL11, the metal features MF11 and the metal vias MV11. In some embodiments, a polymer material is formed (e.g., laminated or coated) to cover the metal features MF11 and the metal vias MV11, and a planarization process (e.g., grinding or polishing process) is performed to remove a portion of the polymer material until the top surfaces of the metal vias MV11 are exposed. The top surface of the polymer layer PM11 is substantially coplanar with the top surfaces of the metal vias MV11. In some embodiments, the polymer layer PM11 includes a polymer material and filler particles. In some embodiments, the polymer material includes polybenzoxazole (PBO), polyimide (PI), benzocyclobutene (BCB), the like, or a combination thereof, and the filler particles include silica, alumina, zinc oxide, titanium dioxide, or the like.

Figure 7:
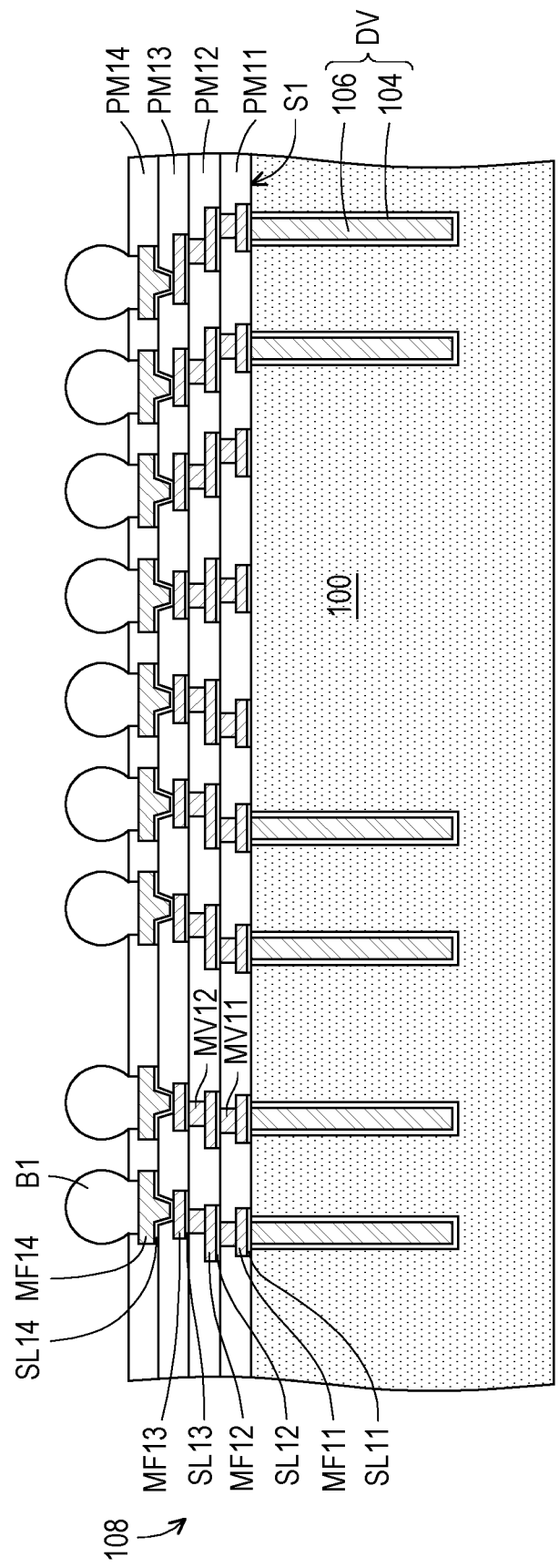

Referring to FIG. 7, the operations similar to those in FIG. 3 to FIG. 6 are performed, so as to form metal features MF12 electrically connected to the metal vias MV11, the metal vias MV12 electrically connected to the metal features MF12, and a polymer layer PM12 surrounding the metal features MF12 and the metal vias MV12. In some embodiments, a seed layer SL12 is formed between each metal feature MF12 and the underlying polymer layer PM11 and the metal via MV11. In some embodiments, the materials of the seed layers SL12, the metal features MF12, the metal vias MV12 and the polymer layer PM12 are similar those of the seed layers SL11, the metal features MF11, the metal vias MV11 and the polymer layer PM11, so the details are not iterated herein.

Thereafter, metal features MF13 are formed to electrically connect to the metal vias MV14, and a polymer layer PM13 is formed to cover the metal features MF13. In some embodiments, a seed layer SL13 is formed between each metal feature MF13 and the underlying polymer layer PM12 and between each metal feature MF13 and the underlying metal via MV12. In some embodiments, the materials of the seed layers SL13, the metal features MF13 and the polymer layer PM13 are similar those of the seed layers SL11, the metal features MF11 and the polymer layer PM11, so the details are not iterated herein.

Afterwards, metal features MF14 (e.g., under bump metallization pads) are formed to penetrate through the polymer layer PM13, and electrically connected to the metal features MF13. In some embodiments, a seed layer SL14 is formed between each metal feature MF14 (e.g., UBM pad) and the underlying metal feature MF13 and each metal feature MF14 (e.g., UBM pad) and the underlying polymer layer PM13. Afterwards, a polymer layer PM14 is formed to cover the metal features MF13. In some embodiments, the materials of the seed layers SL14, the metal features MF14 and the polymer layer PM14 are similar those of the seed layers SL11, the metal features MF11 and the polymer layer PM11, so the details are not iterated herein. The polymer layer PM14 is optional and may be omitted in some embodiments. In some embodiments, a redistribution layer structure 108 of this embodiment is thus completed.

The layer number of the redistribution layer structure 108 of the disclosure is not limited by the figures. The above operations may be repeated as many times as needed. The redistribution layer structure 108 is referred to as a "wiring layer" or "build-up layer" in some examples. The redistribution layer structure 108 of the disclosure is formed with fine-line patterns because it is formed by electroplating processes, rather than the conventional method of attaching copper sheets and creating circuits by partially removing the copper sheets.

Afterward, conductive terminals or bumps B1 are formed to electrically connect to the redistribution layer structure 108. In some embodiments, a patterning process (e.g., a laser drilling, an etching or the like) is performed to the polymer layer PM14, such that openings are formed in the polymer layer PM14 and expose the metal features MF14 (e.g., UBM pads). Thereafter, bumps B1 are formed within the openings of the polymer layer PM14 and electrically connected to the metal features MF13. In some embodiments, the bumps B1 include solder bumps. When solder is used, the solder may include either eutectic solder or non-eutectic solder. The solder may include lead or be lead-free, and may include Sn—Ag, Sn—Cu, Sn—Ag—Cu, or the like. The bumps B1 may be formed by a suitable process such as evaporation, electroplating, ball drop or screen printing. The bumps B1 are regarded as part of the redistribution layer structure 108 in some examples.

Figure 8:
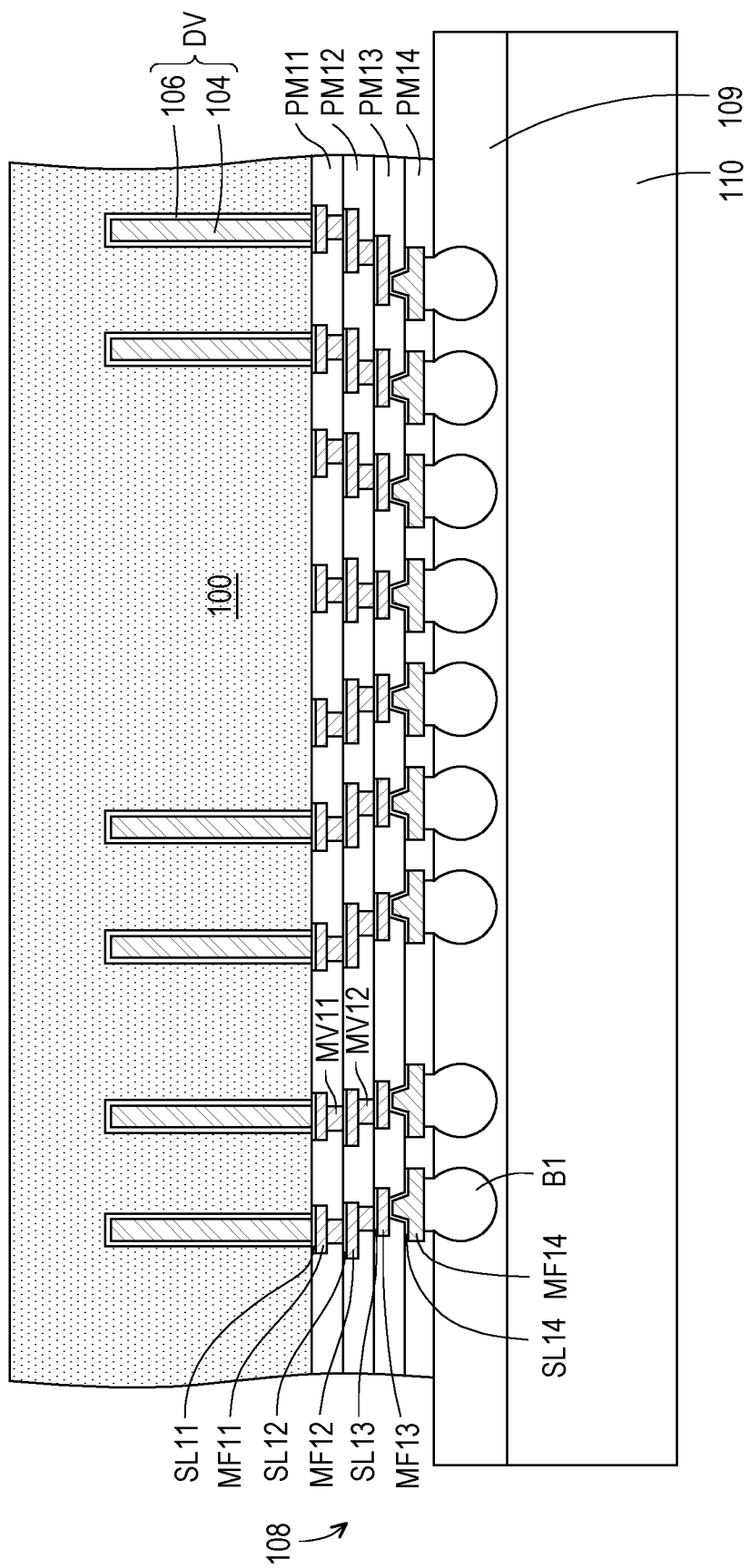

Referring to FIG. 8, the inorganic layer 100 with the redistribution layer structure 108 are turned over and bonded to a glass carrier 110. Specifically, the redistribution layer structure 108 is bonded to the glass carrier 110 through a glue layer 109. In some embodiments, the outermost polymer layer PM14 of the redistribution layer structure 108 faces the glass carrier 110 and is in contact with the glue layer 109, and the bumps B1 are embedded in the glue layer 109. The glue layer 109 may be formed of an adhesive such as an Ultra-Violet (UV) glue, a Light-to-Heat Conversion (LTHC) glue, or the like, although other types of adhesives may be used. In some embodiments, the glue layer 109 is decomposable under the heat of light to thereby release the glass carrier 110 from the structure formed thereon. The glass carrier 110 is configured to support the intermediate structure and will be removed eventually, so other material may be used to replace the glass carrier 110. For example, a silicon carrier or a ceramic carrier may be applicable.

Figure 9:
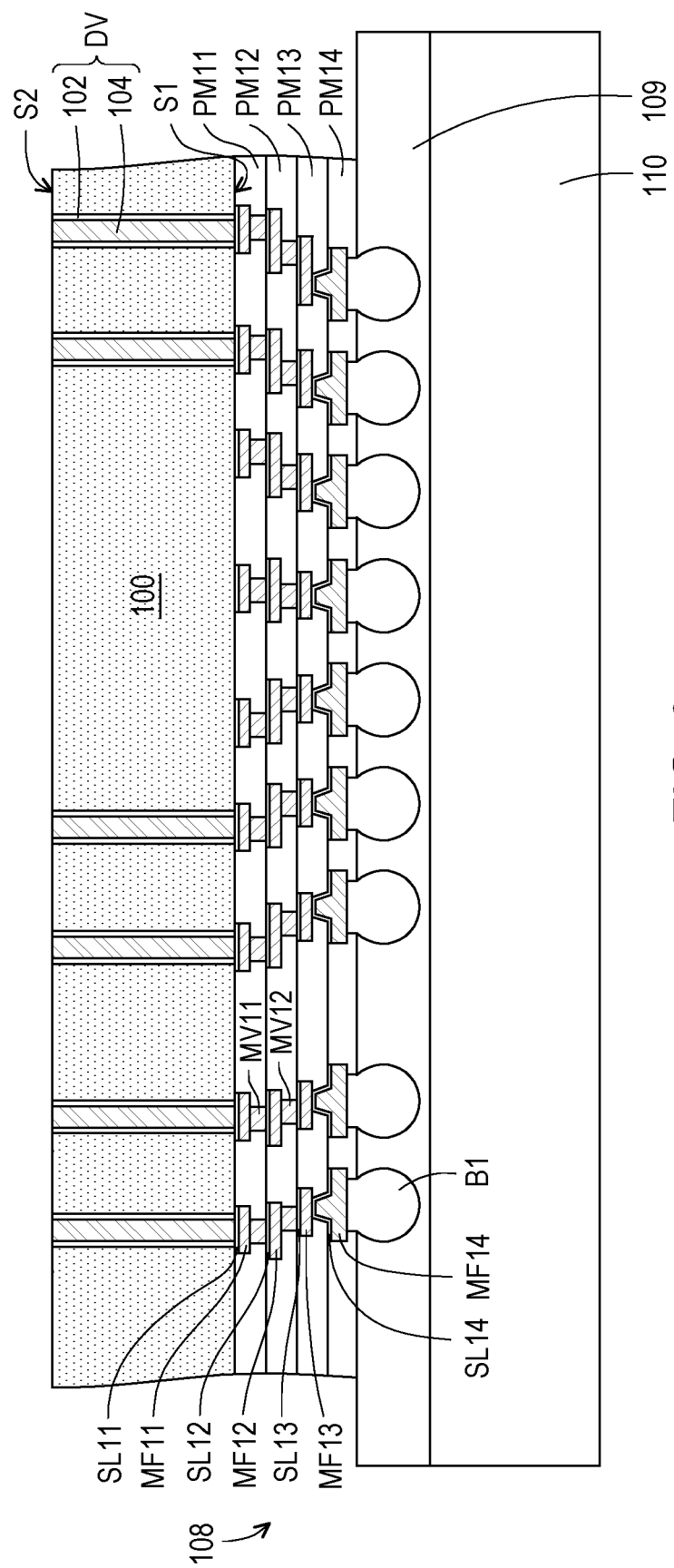

Referring to FIG. 9, a planarization process (e.g., grinding or polishing process) is performed to the second side S2 of the inorganic layer 100, until surfaces of the deep vias DV are exposed. The deep vias DV penetrate through the inorganic layer 100 at this stage. In some embodiments, the deep vias DV are referred to as "through vias" or "through glass vias (TGVs)" in some examples. In some embodiments, a portion of the seed layer 104 in each of the deep vias DV is removed, so the metal layer 106 of each of the deep vias DV is exposed by the second side S2 of the inorganic layer 100.

Figure 10:
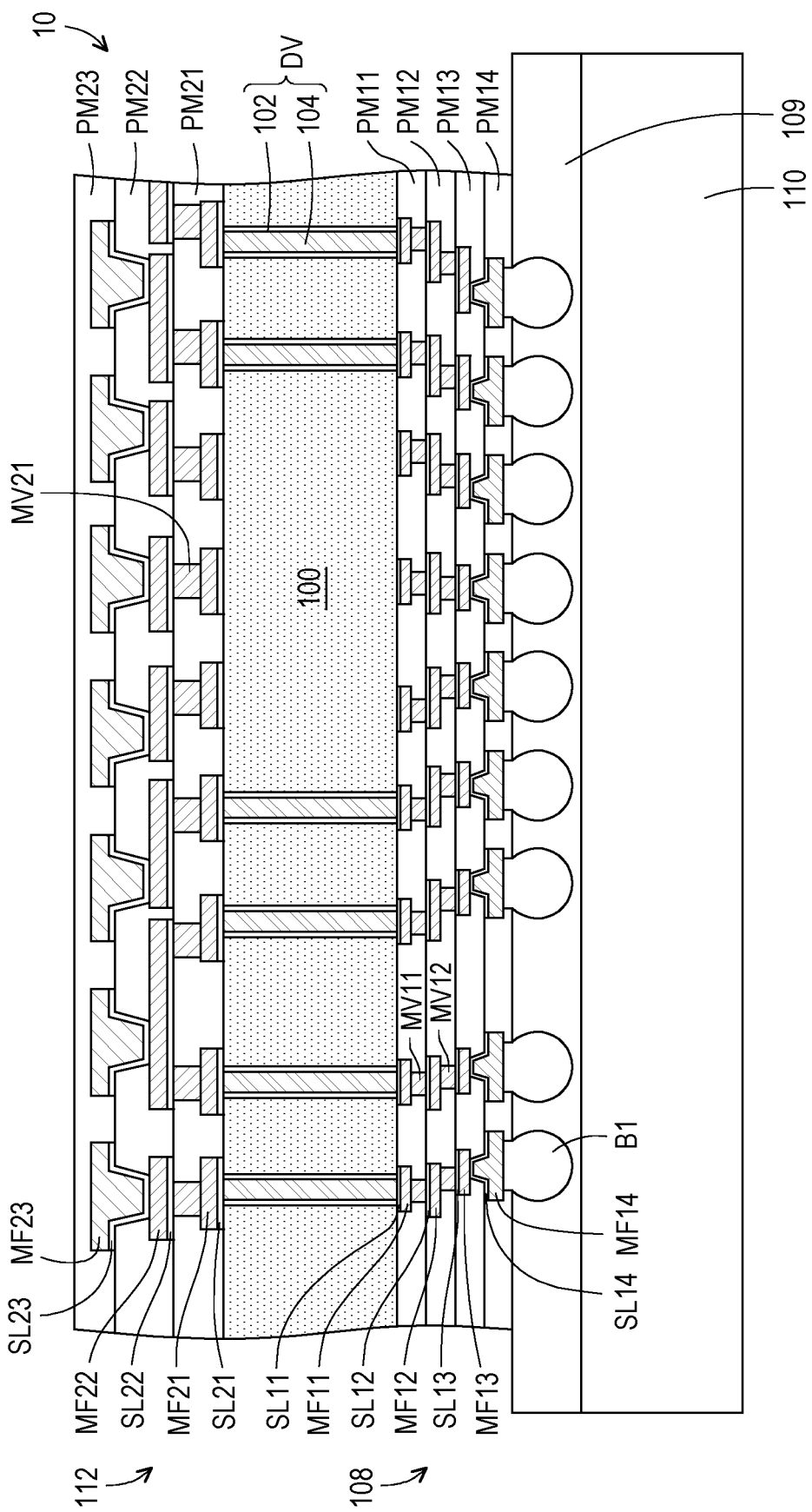

Referring to FIG. 10, a redistribution layer structure 112 is formed on the second side S2 of the inorganic layer 100 and electrically connected to the deep vias DV. The method of forming the redistribution layer structure 112 is similar to the method of forming the redistribution layer structure 108.

In some embodiments, the operations similar to those in FIG. 3 to FIG. 6 are performed, so as to form metal features MF21 electrically connected to the deep vias DV, metal vias MV21 electrically connected to the metal features MF21, and a polymer layer PM21 surrounding the metal features MF21 and the metal vias MV21. In some embodiments, a seed layer SL21 is formed between each metal feature MF21 and the underlying inorganic layer 100 and between each metal feature MF21 and the underlying deep via DV. In some embodiments, the edge of the seed layer SL21 is aligned with the edge of the corresponding metal feature MF21. In other embodiments, the edge of the seed layer SL21 is protruded out from the edge of the corresponding metal feature MF21.

In some embodiments, each of the seed layers SL21, the metal features MF21 and the metal vias MV21 includes Cu, Ti, Ta, W, Ru, Co, Ni. Au or an alloy thereof. For example, the seed layers SL21 include Ti/Cu, the metal features MF21 include Cu, and the metal vias MV21 include Cu. In some embodiments, the polymer layer PM21 includes a polymer material and filler particles. In some embodiments, the polymer material includes polybenzoxazole (PBO), polyimide (PI), benzocyclobutene (BCB), the like, or a combination thereof, and the filler particles include silica, alumina, zinc oxide, titanium dioxide, or the like.

Thereafter, metal features MF22 are formed to electrically connect to the metal vias MV21, and a polymer layer PM22 is formed to cover the metal features MF22. In some embodiments, a seed layer SL22 is formed between each metal feature MF22 and the underlying polymer layer PM21 and between each metal feature MF22 and the underlying metal via MV21. In some embodiments, the materials of the seed layers SL22, the metal features MF22 and the polymer layer PM22 are similar those of the seed layers SL21, the metal features MF21 and the polymer layer PM21, so the details are not iterated herein.

Afterwards, metal features MF23 (e.g., under bump metallization pads) are formed to penetrate through the polymer layer PM22, and electrically connected to the metal features MF22. In some embodiments, a seed layer SL23 is formed between each metal feature MF23 (e.g., UBM pad) and the underlying metal feature MF22 and between each metal feature MF23 (e.g., UBM pad) and the underlying polymer layer PM22. Afterwards, a polymer layer PM23 is formed to cover the metal features MF23. In some embodiments, a redistribution layer structure 112 of this embodiment is thus completed, in which the metal features MF23 are the outermost metal features for ball mount, and the polymer layer PM23 is the outermost polymer layer serving as a buffer layer or protection layer. In some embodiments, the materials of the seed layers SL23, the metal features MF23 and the polymer layer PM23 are similar those of the seed layers SL21, the metal features MF21 and the polymer layer PM21, so the details are not iterated herein. The polymer layer PM23 is optional and may be omitted in some embodiments. In some embodiments, a redistribution layer structure 112 of this embodiment is thus completed.

The layer number of the redistribution layer structure 112 of the disclosure is not limited by the figures. The above operations may be repeated as many times as needed. The redistribution layer structure 112 is referred to as a "wiring layer" or "build-up layer" in some examples. The redistribution layer structure 112 of the disclosure is formed with fine-line patterns because it is formed by electroplating processes, rather than the conventional method of attaching copper sheets and creating circuits by partially removing the copper sheets.

In some embodiments, the dimension of the redistribution layer structure 112 is different from (e.g., greater than) the dimension of the redistribution layer structure 108. In some embodiments, the dimension includes a width, a height or a critical dimension (e.g., the smallest dimension) of the metal features of the redistribution layer structure. For example, the ratio of the critical dimension (e.g., the smallest line width or via width) of the redistribution layer structure 108 to the critical dimension (e.g., the smallest line width or via width) of the redistribution layer structure 112 ranges from about 1:50 to 1:200, such as from about 1:100 to 1:150.

In some embodiments, the inorganic layer 100, the redistribution layer structure 108 and the redistribution layer structure 112 constitute a glass substrate 10, in which the redistribution layer structure 108 and the redistribution layer structure 112 are electrically connected to each other through the deep vias DV in the inorganic layer 100. The glass substrate 10 is referred to as a "glass circuit board" or "integrated glass substrate" in some examples. The glass substrate 10 is a wafer-type glass substrate at this stage.

Figure 11:
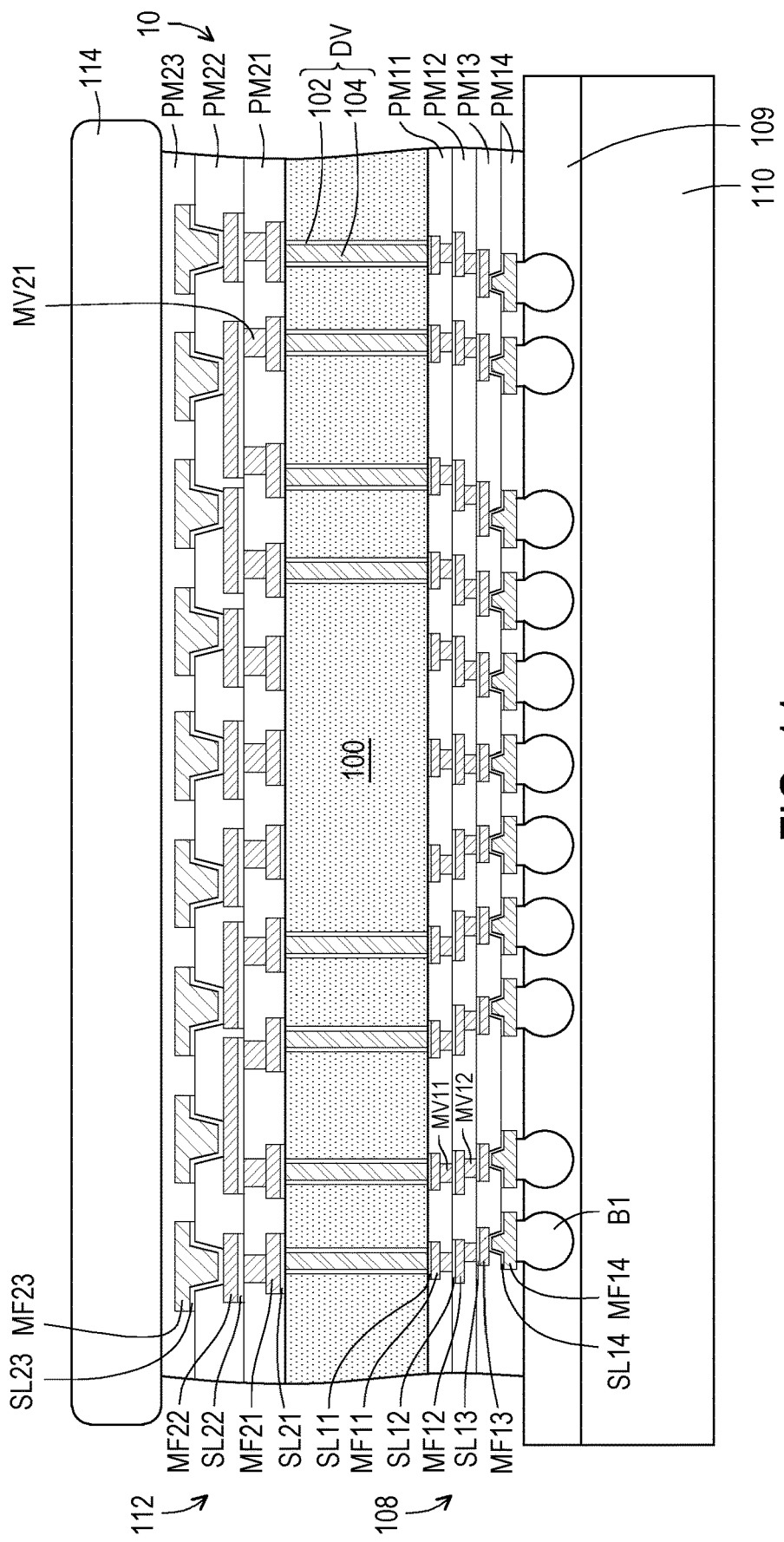

Referring to FIG. 11, a tape 114 is laminated on the glass substrate 10. In some embodiments, the outermost polymer layer PM23 of the redistribution layer structure 112 of the glass substrate 10 faces the tape 114. The tape 114 is referred to a "wafer tape" in some examples.

Figure 12:
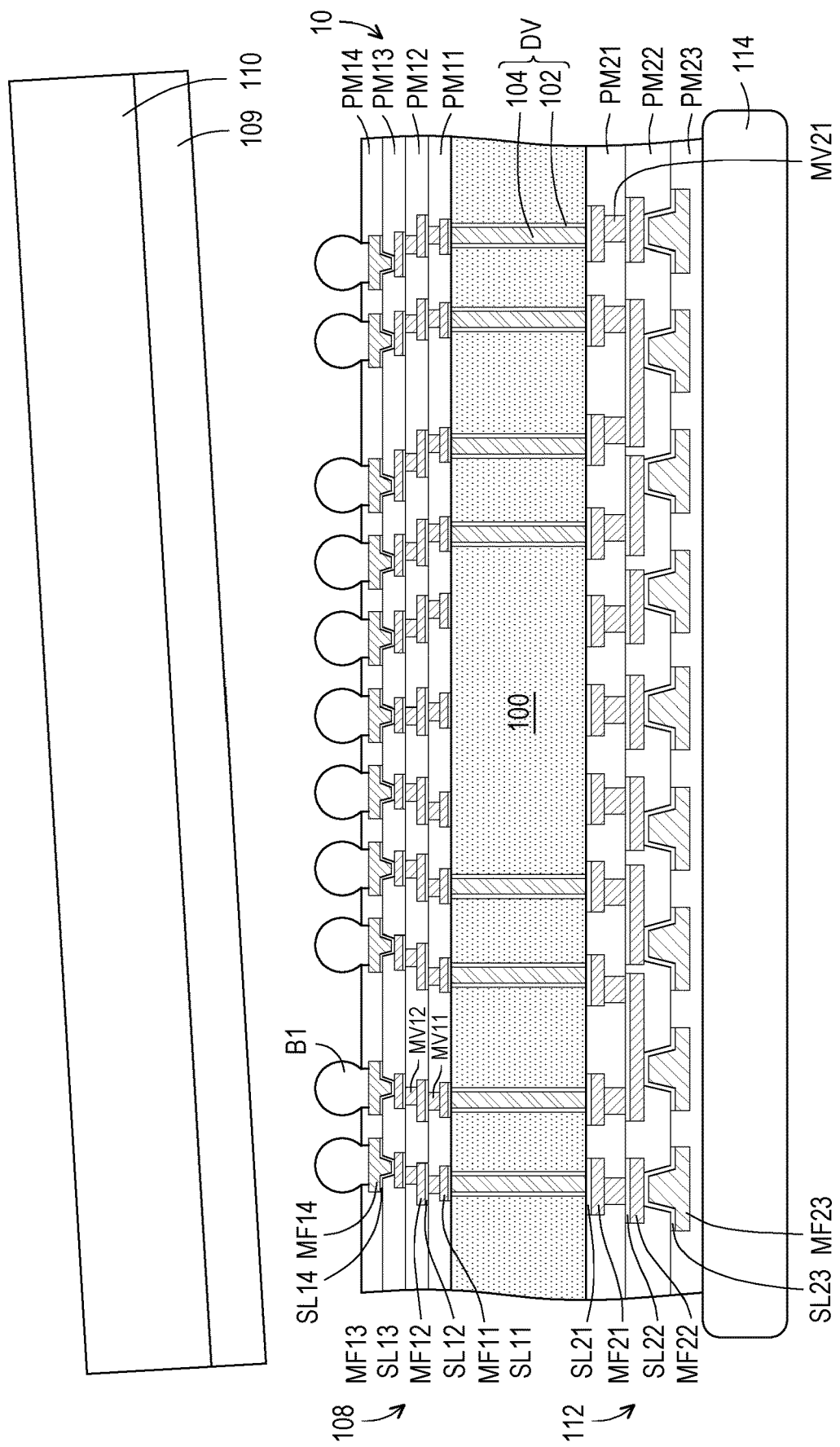

Referring to FIG. 12, the glass substrate 10 with the tape 114 are turned over, and the glass carrier 110 is removed from the redistribution layer structure 108 of the glass substrate 10. In some embodiments, the glue layer 109 is decomposed under heat of light, and the glass carrier 110 is then released from the redistribution layer structure 108. The carrier releasing operation is referred to as a "de-bonding" process in some examples.

Figure 13:
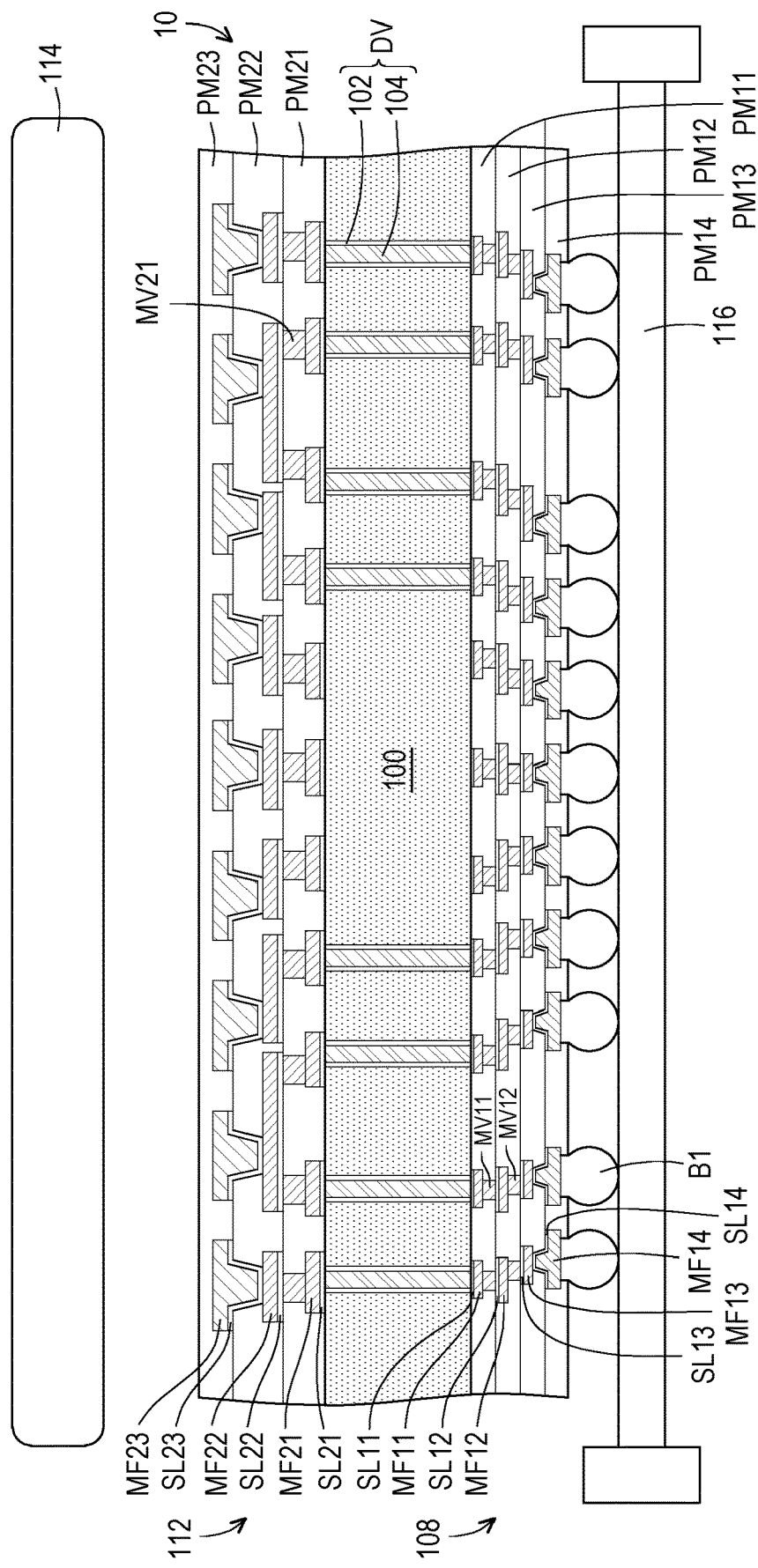

Referring to FIG. 13, the glass substrate 10 with the tape 114 are turned over, and mounted on a frame 116. Specifically, the redistribution layer structure 108 is placed on the frame 116. In some embodiments, the outermost polymer layer PM14 of the redistribution layer structure 108 of the glass substrate 10 faces the frame 116. Thereafter, the tape 114 is removed from the redistribution layer structure 112 of the glass substrate 10. The tape removing operation is referred to as a "de-tape" process in some examples.

Figure 14:
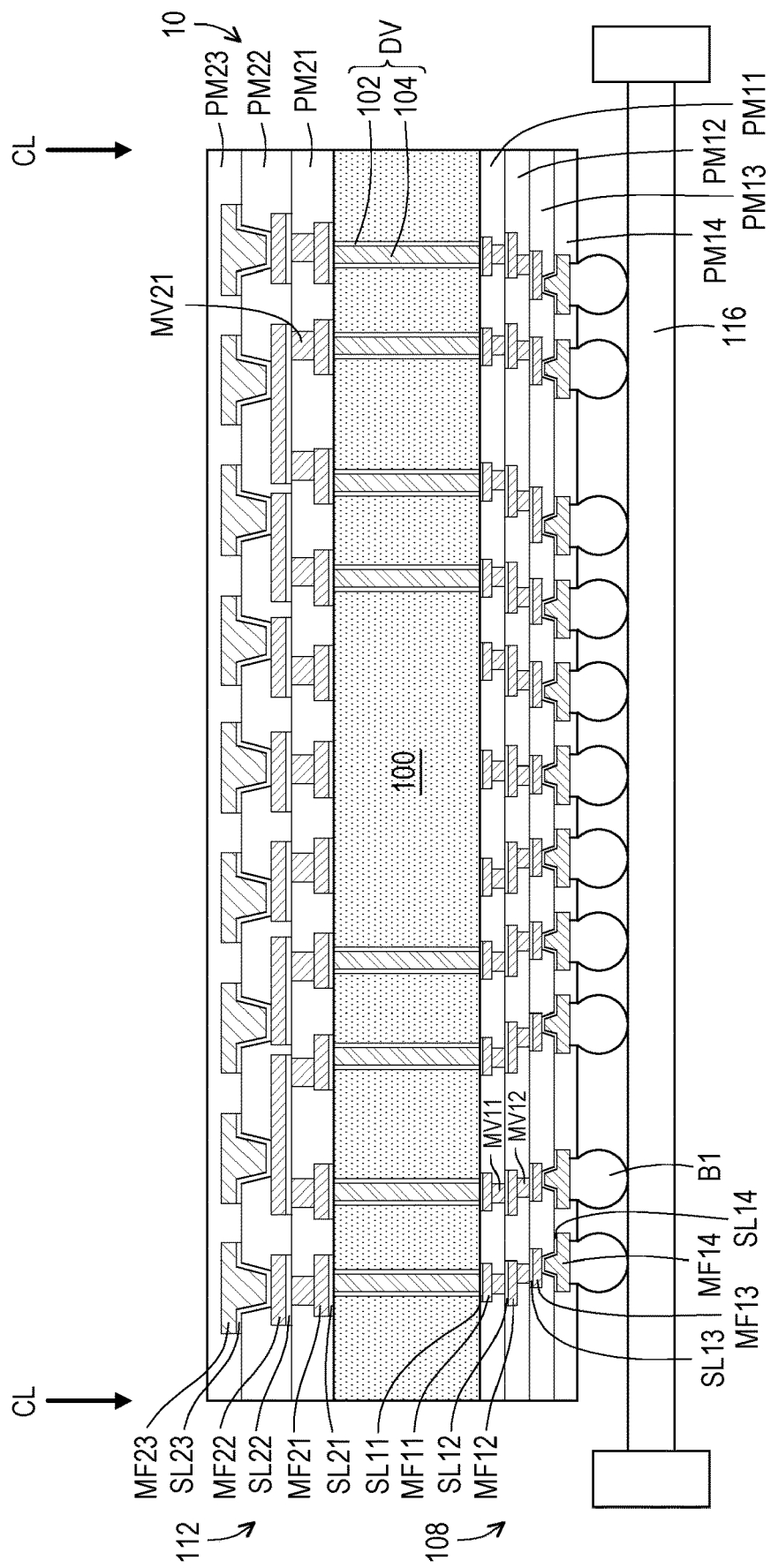

Referring to FIG. 14, a singulation process is performed to separate the wafer-type glass substrate into multiple chiplet-type glass substrates. In some embodiments, the singulation process includes a wafer sawing process with a laser scribing along cutting lines CL of the wafer. Specifically, the wafer dicing process is performed on the structure of FIG. 14 along the cutting lines CL, so as to cut through the redistribution layer structure 112, the inorganic layer 100 and the redistribution layer structure 108. After the wafer dicing process or singulation process, the adjacent glass substrates 10 are separated from each other.

Figure 15:
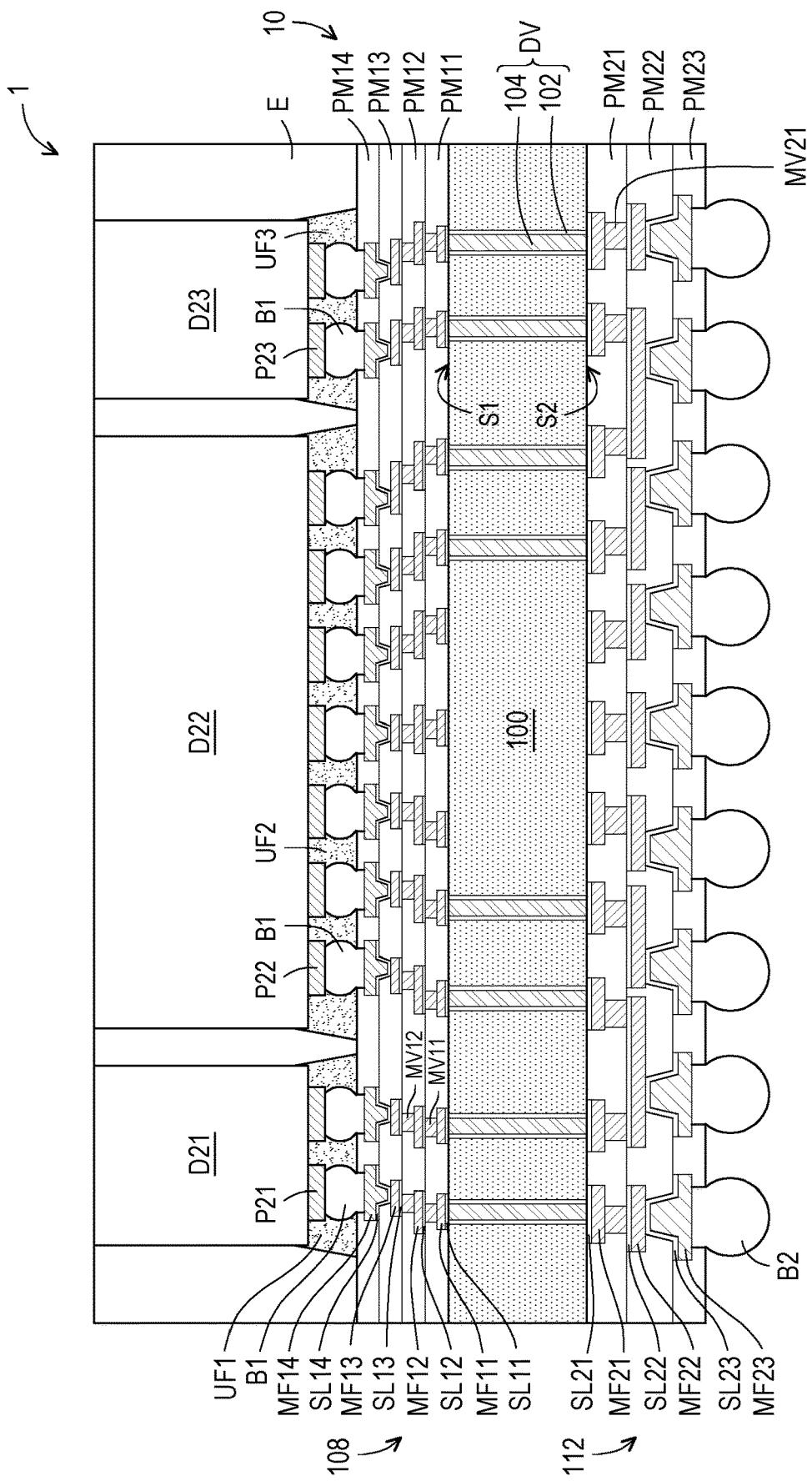

Referring to FIG. 15, semiconductor dies D21, D22 and D23 are provided and bonded to the redistribution layer structure 108 of the glass substrate 10. In some embodiments, the semiconductor dies D21, D22 and D23 are flip-chip bonded to the glass substrate 10. In some embodiments, each of the semiconductor dies D21, D22 and D23 may include a logic die, a memory die, a CPU, a GPU, an xPU, a MEMS die, a SoC die, or the like. In some embodiments, each of the semiconductor dies D21, D22 and D23 may be substituted with a die stack including multiple dies stacked vertically.

In some embodiments, each of the semiconductor dies D21, D22 and D23 may include one or more functional devices such as active components and/or passive components. In some embodiments, one of the semiconductor dies D21, D22 and D23 may be a device-free dummy die. In some embodiments, at least one of the semiconductor dies D21, D22 and D23 may have a function different from that of the other of the semiconductor dies D21, D22 and D23. For example, each of the semiconductor dies D21 and D23 is a memory stack, such as High Bandwidth Memory (HBM) cube, and the semiconductor die D22 is a SoC die. In some embodiments, at least one of the semiconductor dies D21, D22 and D23 may have a dimension different from that of the other of the semiconductor dies D21, D22 and D23. The dimension may be a height, a width, a size, a top-view area or a combination thereof. In some embodiments, the semiconductor dies D21, D22 and D23 include die pads P21, P22 and P23, respectively. In some embodiments, each of the semiconductor dies D21, D22 and D23 further includes die bumps over the die pads for connecting to the bumps B1 of the glass substrate 10. The die bumps include solder bumps. When solder is used, the solder may include either eutectic solder or non-eutectic solder. The solder may include lead or be lead-free, and may include Sn—Ag, Sn—Cu, Sn—Ag—Cu, or the like. In some embodiments, the die bumps of the semiconductor dies D21, D22 and D23 are bonded to the bumps B1 of the glass substrate 10.

In some embodiments, an underfill layer UF1 is provided between the glass substrate 10 and the semiconductor die D21 and around the bumps B1, an underfill layer UF2 is provided between the glass substrate 10 and the semiconductor die D22 and around the bumps, and an underfill layer UF3 is provided between the glass substrate 10 and the semiconductor die D23 and around the bumps B1. In some embodiments, each of the underfill layers UF1, UF2 and UF3 includes a molding compound such as epoxy, and is formed using dispensing, injecting, and/or spraying process.

In some embodiments, the underfill layers UF1, UF2 and UF3 are spaced from each other. In some embodiments, an underfill block may be provided on the glass substrate 10 between the semiconductor dies D21 and D22, so as to prevent the underfill layers UF1 and UF2 from bleeding to undesired components. In some embodiments, an underfill block may be provided on the glass substrate 10 between the semiconductor dies D22 and D23, so as to prevent the underfill layers UF2 and UF3 from bleeding to undesired components. However, the disclosure is not limited thereto. In some embodiments, the underfill layers UF1, UF2 and UF3 are connected to each other. The underfill layers UF1, UF2 and UF3 are optional and may be omitted in some examples.

In some embodiments, an encapsulation layer E is formed to encapsulate the semiconductor dies D21, D22 and D23. In some embodiments, the encapsulation layer E includes a molding compound, epoxy, or the like, and may be applied by compression molding, transfer molding, or the like. The encapsulation layer E may be formed over the glass substrate 10 and covering the semiconductor dies D21, D22 and D23. Thereafter, the encapsulation layer E may be optionally removed by a planarization process (e.g., grinding or polishing process), until top surfaces of the semiconductor dies D21, D22 and D23 are exposed.

Thereafter, the frame 116 is removed from the redistribution layer structure 112, and conductive terminals or bumps B2 are formed to electrically connect to the redistribution layer structure 112.

The bumps B2 are formed to electrically connect to the redistribution layer structure 112. In some embodiments, a patterning process (e.g., a laser drilling, an etching or the like) is performed to the polymer layer PM23, such that openings are formed in the polymer layer PM23 and expose the metal features MF23 (e.g., UBM pads). Thereafter, bumps B2 are formed within the openings of the polymer layer PM23 and electrically connected to the metal features MF23. In some embodiments, the bumps B2 include solder bumps. When solder is used, the solder may include either eutectic solder or non-eutectic solder. The solder may include lead or be lead-free, and may include Sn—Ag, Sn—Cu, Sn—Ag—Cu, or the like. The bumps B2 may be formed by a suitable process such as evaporation, electroplating, ball drop, or screen printing. The bumps B2 are regarded as part of glass substrate 10 in some examples. In some embodiments, a semiconductor structure 1 is thus completed.

Figure 16:
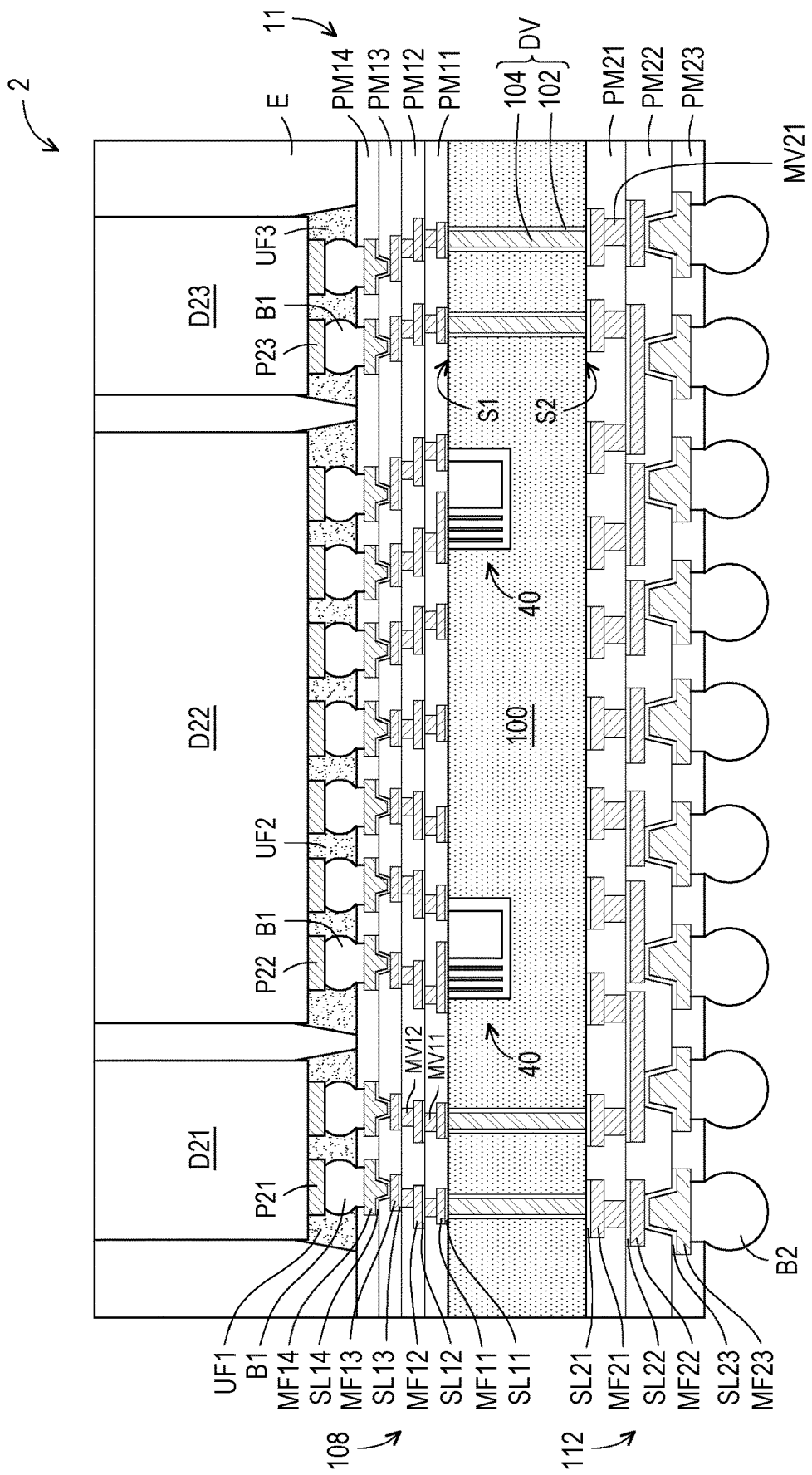
FIG. 16 to FIG. 20 are cross-sectional views schematically illustrating various semiconductor structure in accordance with some embodiments of the present disclosure.

FIG. 16 is a cross-sectional view schematically illustrating a semiconductor structure in accordance with some embodiments of the present disclosure. The semiconductor structure 2 of FIG. 16 is similar to the semiconductor structure 1 of FIG. 15, and the difference between them lies in the type of the glass substrate. In the semiconductor structure 1 of FIG. 15, the glass substrate 10 is a device-free glass substrate. However, in the semiconductor structure 2 of FIG. 16, the glass substrate 11 is a device-containing glass substrate. In some embodiments, one or more devices 40 are embedded in the inorganic layer 100 and electrically to one of the redistribution layer structures 108 and 112. In some embodiments, as shown in FIG. 16, the devices 40 are embedded in the inorganic layer 100 and electrically to the redistribution layer structure 108. In some embodiments, the devices 40 are integrated passive devices, such as capacitors.

Figure 17:
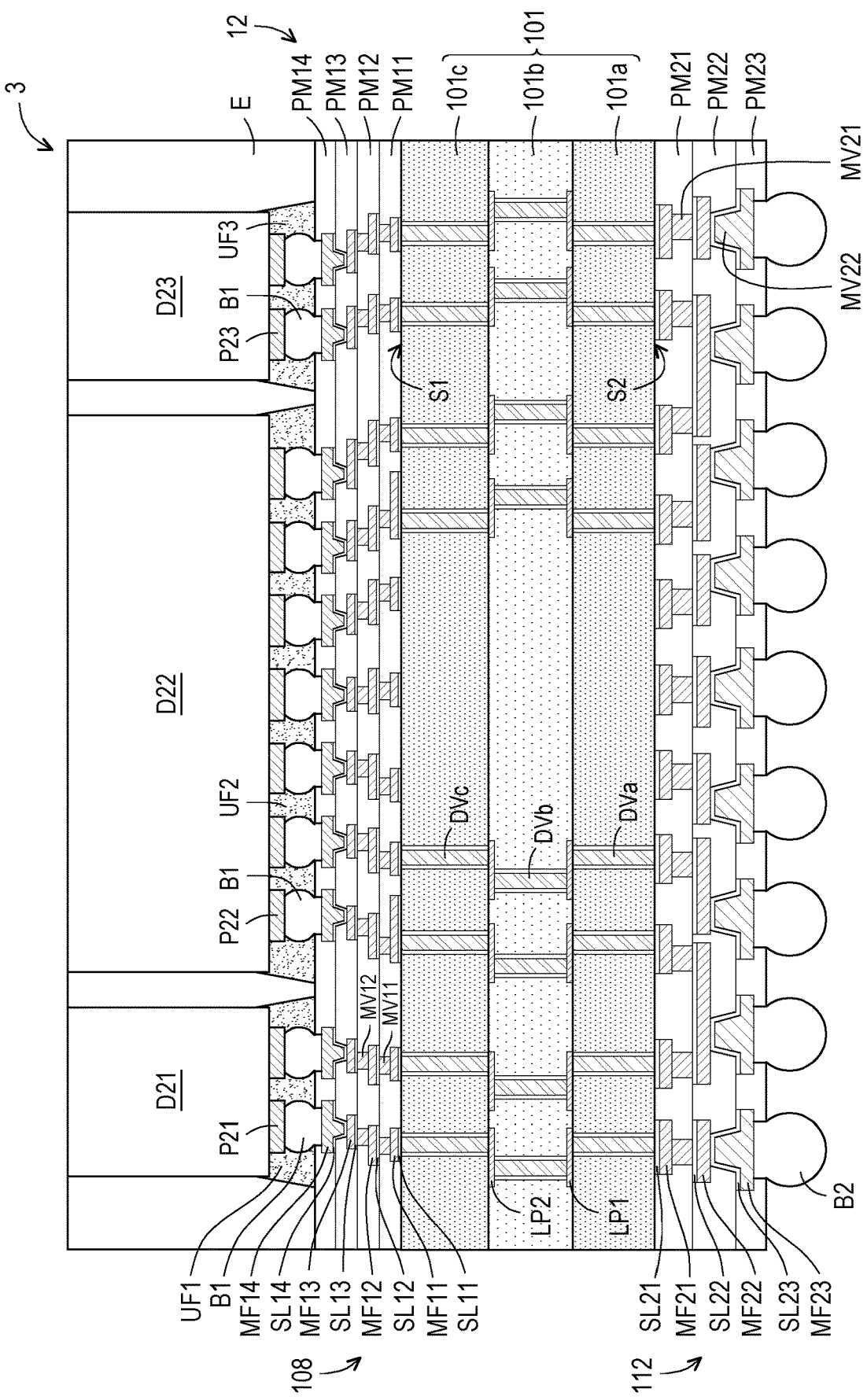

FIG. 17 is a cross-sectional view schematically illustrating a semiconductor structure in accordance with some embodiments of the present disclosure. The semiconductor structure 3 of FIG. 17 is similar to the semiconductor structure 1 of FIG. 15, and the difference between them lies in the configuration of the glass carrier of the glass substrate. In the semiconductor structure 1 of FIG. 15, the inorganic layer 100 of the glass substrate 10 is a single-layer core and includes deep vias DV electrically to the redistribution layer structures 108 and 112. However, in the semiconductor structure 3 of FIG. 17, the inorganic layer 101 of the glass substrate 12 is a multi-layer core. In some embodiments, the inorganic layer includes a glass layer, a quartz layer, the like, or a combination thereof. The inorganic layer 101 is referred to as an "inorganic core layer", "glass core layer", "glass layer", "glass carrier" or "glass support" in some examples. In some embodiments, the glass carrier is replaced by a quartz carrier. In some embodiments, glass is non-crystalline silica, while quartz is crystalline mineral composed of silica. In some embodiments, the inorganic layer 101 includes a quartz layer 101b sandwiched by a lower glass layer 101a and an upper glass layer 101c. In some embodiments, the hardness of the quartz layer 101b is greater than the hardness of the glass layer 101a or 101c, so as to provide more robustness for the glass substrate 12. In some embodiments, the quartz layer 101b have deep vias DVb electrically connected to the deep vias DVa of the glass layer 101a and the deep vias DVc of the glass layer 101c. The deep vias DVa of the glass layer 101a is electrically connected to the redistribution layer structure 112, and the deep vias DVc of the glass layer 101c is electrically connected to the redistribution layer structure 108. In some embodiments, landing pads LP1 are provided between and electrically connected to the deep vias DVa of the glass layer 101a and the deep vias DVb of the quartz layer 101b, and the landing pads LP1 are embedded in the glass layer 101b. In some embodiments, landing pads LP2 are provided between and electrically connected to the deep vias DVc of the glass layer 101c and the deep vias DVb of the quartz layer 101b, and the landing pads LP2 are embedded in the glass layer 101b. However, the disclosure is not limited thereto. In other embodiments, the landing pads LP1 and LP2 may be embedded in the glass layers 101a and 101c, respectively. In some embodiments, the landing pads LP1 and LP2 are optional and may be omitted as needed. In some embodiments, the glass layer 101a and the deep vias DVa are optional and may be omitted for reducing the cost and total thickness. Specifically, the redistribution layer structure 112 is in contact with the deep vias DVb in some examples.

Figure 18:
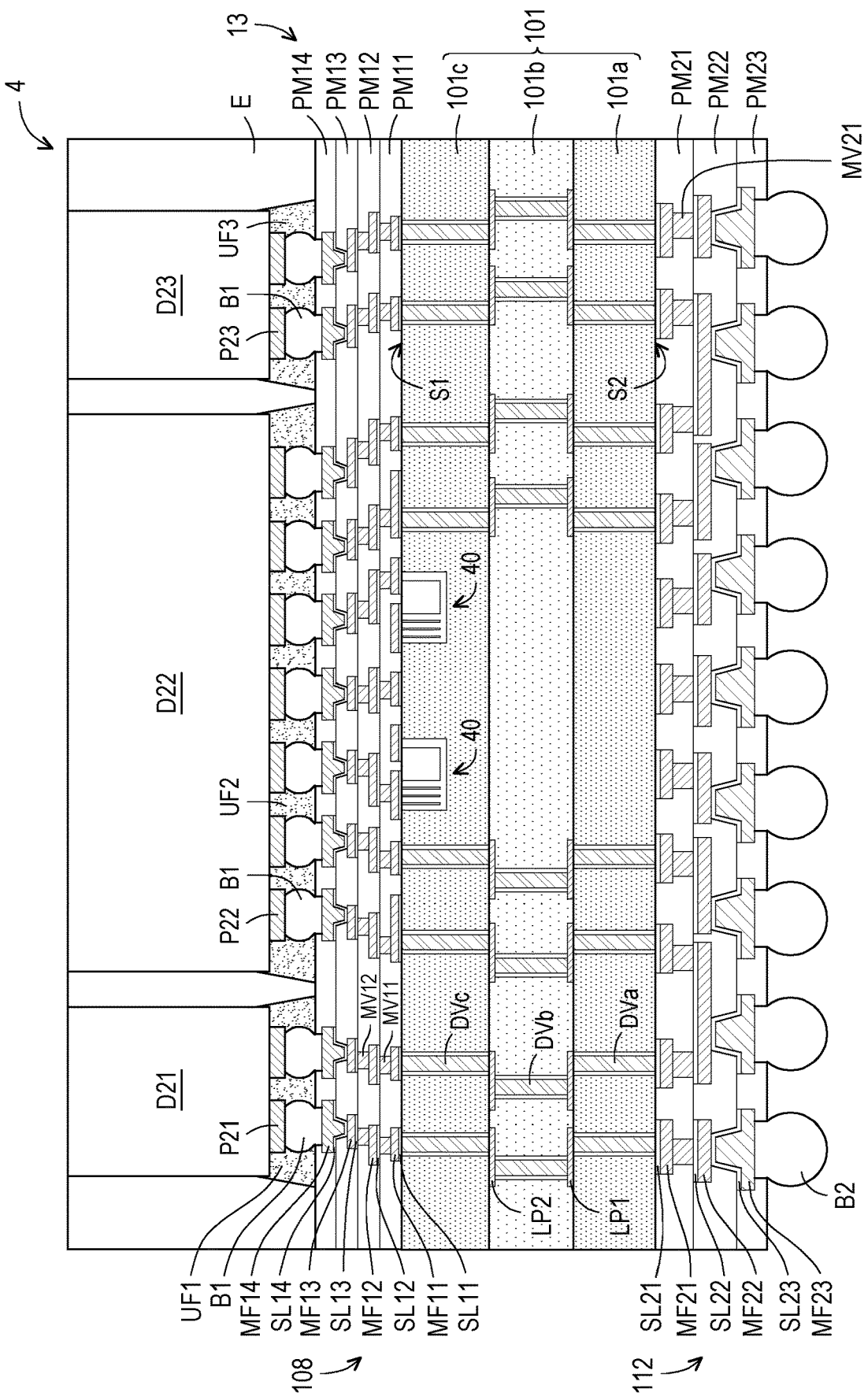

FIG. 18 is a cross-sectional view schematically illustrating a semiconductor structure in accordance with some embodiments of the present disclosure. The semiconductor structure 4 of FIG. 18 is similar to the semiconductor structure 3 of FIG. 17, and the difference between them lies in that, the inorganic layer 101 of the glass substrate 13 further includes one or more devices 40 embedded in the glass layer 101c and electrically to the redistribution layer structure 108. In some embodiments, the devices 40 are integrated passive devices, such as capacitors.

Figure 19:
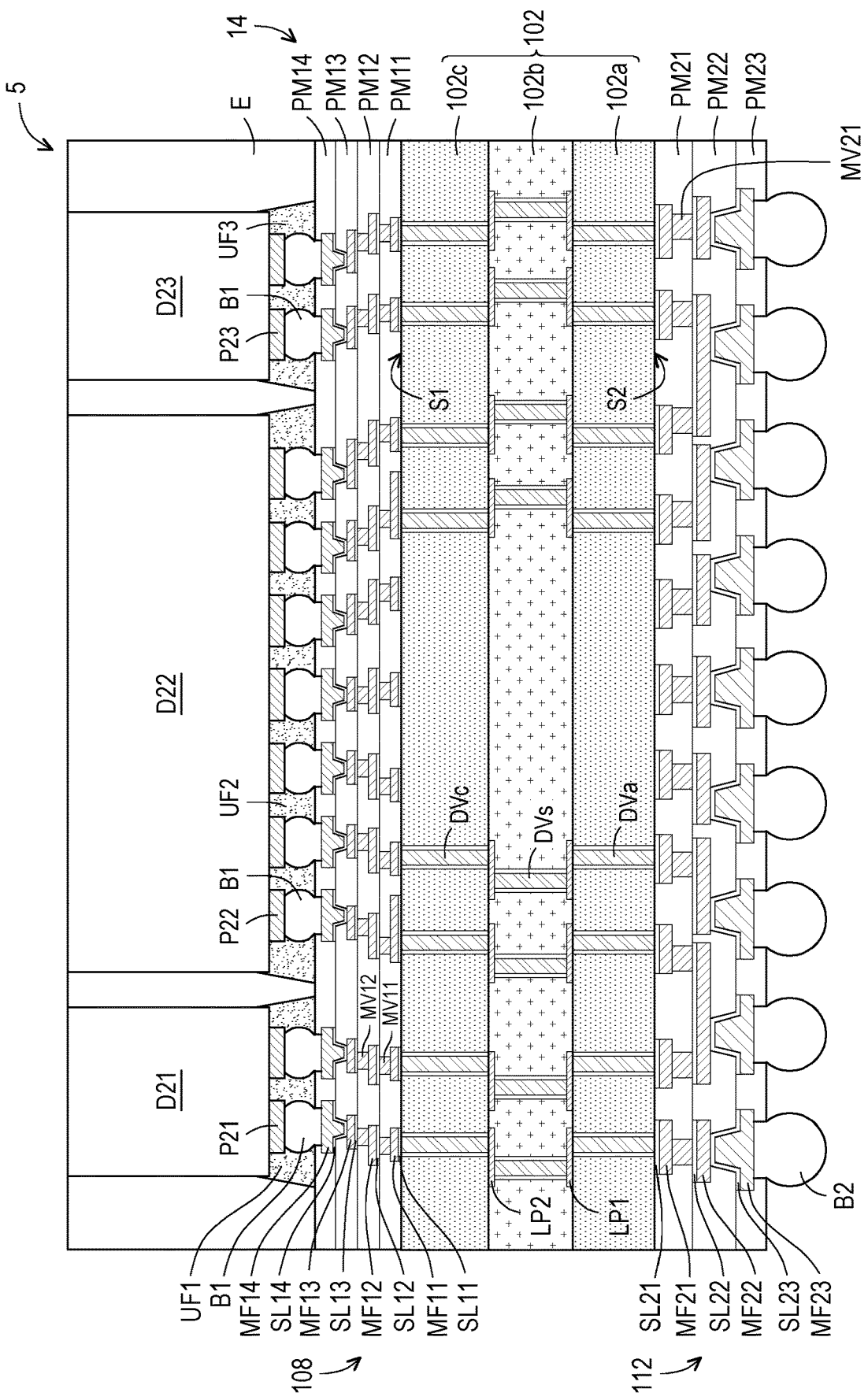

FIG. 19 is a cross-sectional view schematically illustrating a semiconductor structure in accordance with some embodiments of the present disclosure. The semiconductor structure 5 of FIG. 19 is similar to the semiconductor structure 1 of FIG. 15, and the difference between them lies in the composition of the glass carrier of the glass substrate. In the semiconductor structure 1 of FIG. 15, the inorganic layer 100 of the glass substrate 10 is a single-material core and includes deep vias DV electrically to the redistribution layer structures 108 and 112. However, in the semiconductor structure 5 of FIG. 19, the glass-containing layer 102 of the glass substrate 14 is a multi-material core. In some embodiments, the glass-containing layer 102 includes, a silicon layer 102b sandwiched by a lower glass layer 102a and an upper glass layer 102c. The glass-containing layer 102 is referred to as a "glass-containing core layer" in some examples. In some embodiments, the disposition of the silicon layer 102b is to provide more heat dissipation for the glass substrate 14. In some embodiments, the silicon layer 102b have deep vias DVs electrically connected to the deep vias DVa of the glass layer 102a and the deep vias DVc of the glass layer 102c. The deep vias DVs are referred to as "through silicon vias (TSVs)" in some examples. The deep vias DVa of the glass layer 102a is electrically connected to the redistribution layer structure 112, and the deep vias DVc of the glass layer 102c is electrically connected to the redistribution layer structure 108. In some embodiments, landing pads LP1 are provided between and electrically connected to the deep vias DVa of the glass layer 102a and the deep vias DVs of the silicon layer 102b, and the landing pads LP1 are embedded in the silicon layer 102b. In some embodiments, landing pads LP2 are provided between and electrically connected to the deep vias DVc of the glass layer 102c and the deep vias DVs of the silicon layer 102b, and the landing pads LP2 are embedded in the silicon layer 102b. However, the disclosure is not limited thereto. In other embodiments, the landing pads LP1 and LP2 may be embedded in the glass layers 102a and 102c, respectively. In some embodiments, the landing pads LP1 and LP2 are optional and may be omitted as needed. In some embodiments, the glass layer 102a and the deep vias DVa are optional and may be omitted for reducing the cost and total thickness. Specifically, the redistribution layer structure 112 is in contact with the deep vias DVs in some examples.

Figure 20:
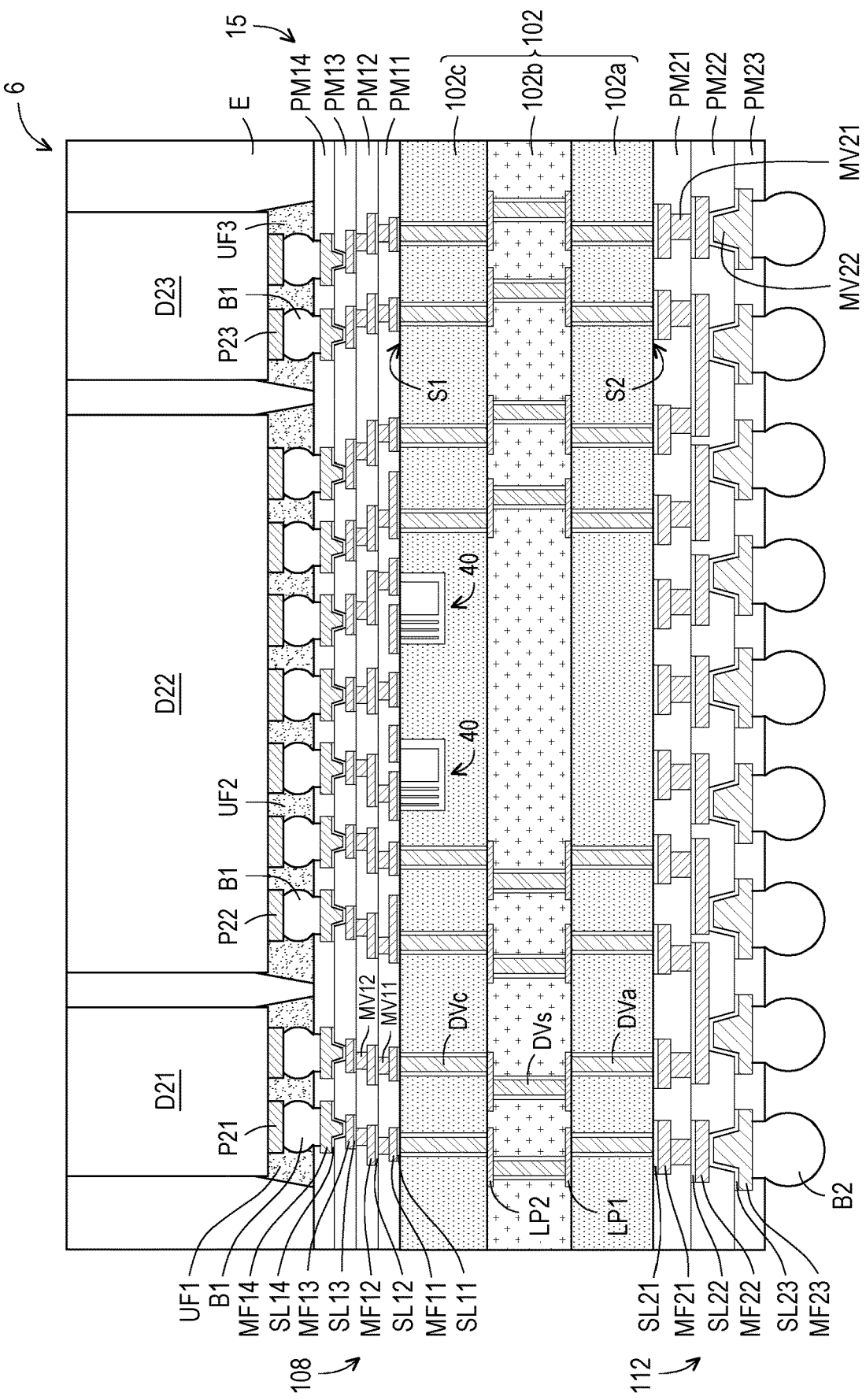

FIG. 20 is a cross-sectional view schematically illustrating a semiconductor structure in accordance with some embodiments of the present disclosure. The semiconductor structure 6 of FIG. 20 is similar to the semiconductor structure 5 of FIG. 19, and the difference between them lies in that, the glass-containing layer 102 of the glass substrate 15 further includes one or more devices 40 are embedded in the glass layer 102c and electrically to the redistribution layer structure 108. In some embodiments, the devices 40 are integrated passive devices, such as capacitors.

In some embodiments, the disclosure provides an integrated glass substrate with low power loss, high electrical performance and adjustable CTE property. In the disclosure, smaller and finer metal features/vias are manufactured on the core glass material, so as to reduce the size of the integrated glass substrate. Besides, the integrated glass substrate of the disclosure is a process carrier and such configuration can simplify the process of system integrated substrate.

Figure 21:
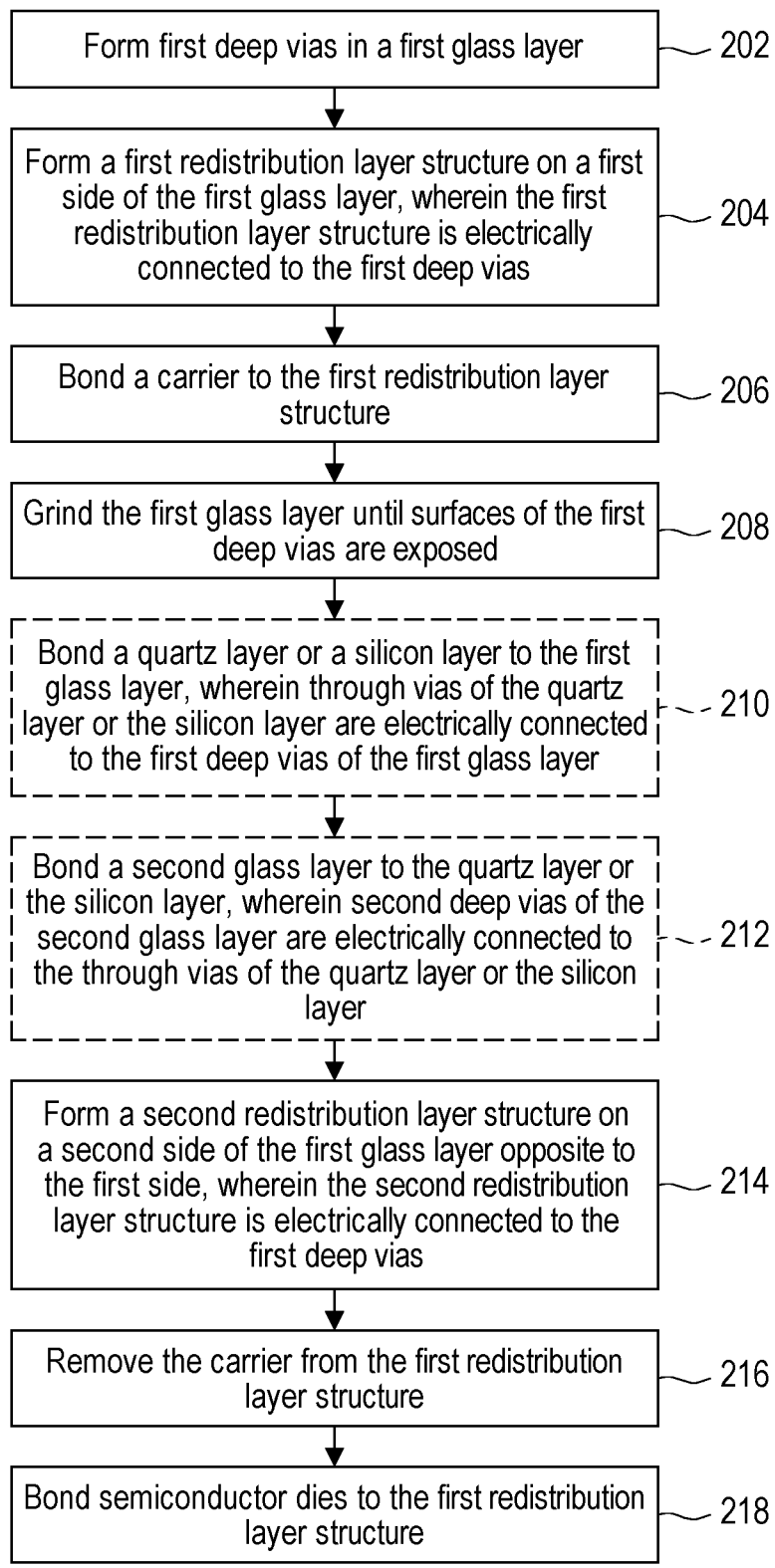
FIG. 21 illustrates a method of forming a semiconductor structure in accordance with some embodiments of the present disclosure.

FIG. 21 illustrates a method of forming a semiconductor structure in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 202, first deep vias are formed in a first glass layer. FIG. 1 to FIG. 2 illustrate cross-sectional views corresponding to some embodiments of act 202. In some embodiments, a method of forming the first deep vias includes forming deep openings in the first glass layer, forming a seed layer conformally on sidewalls and bottoms of the deep openings, and forming the deep vias in the deep openings by using the seed layer as a seed. In some embodiments, at least one integrated passive device is further formed and embedded by the first glass layer, as shown in FIG. 16, FIG. 18 and FIG. 20.

At act 204, a first redistribution layer structure is formed on a first side of the first glass layer, and the first redistribution layer structure is electrically connected to the first deep vias. FIG. 3 to FIG. 7 illustrate cross-sectional views corresponding to some embodiments of act 204. In some embodiments, a method of forming the first redistribution layer structure includes forming a first seed layer on the first side of the first glass layer, forming a first metal feature by using the first seed layer as a seed, and forming a first metal via by using the first metal feature as a seed. In some embodiments, the method of forming the first redistribution layer structure further includes forming first bumps on the uppermost metal features before bonding the first redistribution layer structure to a carrier.

At act 206, a carrier is bonded to the first redistribution layer structure. FIG. 8 illustrates a cross-sectional view corresponding to some embodiments of act 206.

At act 208, the first glass layer is grinded until surfaces of the first deep vias are exposed. FIG. 9 illustrates a cross-sectional view corresponding to some embodiments of act 208.

At act 210, a quartz layer or a silicon layer is bonded to the first glass layer, and through vias of the quartz layer or the silicon layer are electrically connected to the first deep vias of the first glass layer. FIG. 17 to FIG. 20 illustrate cross-sectional views corresponding to some embodiments of act 210. In some embodiments, the bonding at act 210 includes a direct bonding. In some embodiments, the bonding at act 210 includes an indirect bonding with an adhesive layer between the first glass layer and the quartz layer or the silicon layer. Act 210 is optional and may be omitted as needed.

At act 212, a second glass layer is bonded to the quartz layer or the silicon layer, and second deep vias of the second glass layer are electrically connected to the through vias of the quartz layer or the silicon layer. FIG. 17 to FIG. 20 illustrate cross-sectional views corresponding to some embodiments of act 212. In some embodiments, the bonding at act 212 includes a direct bonding. In some embodiments, the bonding at act 212 includes an indirect bonding with an adhesive layer between the second glass layer and the quartz layer or the silicon layer. Act 212 is optional and may be omitted as needed.

At act 214, a second redistribution layer structure is formed on a second side of the first glass layer opposite to the first side, and the second redistribution layer structure is electrically connected to the deep vias. FIG. 10 illustrates a cross-sectional view corresponding to some embodiments of act 214. In some embodiments, a method of forming the second redistribution layer structure includes forming a second seed layer on the second side of the first glass layer, forming a second metal feature by using the second seed layer as a seed, and forming a second metal via by using the second metal feature as a seed. In some embodiments, a critical dimension of the second redistribution layer structure is different from (e.g., greater than) a critical dimension of the first redistribution layer structure.

At act 216, the carrier is removed from the first redistribution layer structure. FIG. 11 and FIG. 12 illustrate cross-sectional views corresponding to some embodiments of act 216.

At act 218, semiconductor dies are bonded to the first redistribution layer structure. FIG. 13 to FIG. 20 illustrate cross-sectional views corresponding to some embodiments of act 218. In some embodiments, second bumps are further formed to electrically connect to the uppermost metal features of the second redistribution layer structure before or after the semiconductor dies are bonded to the first redistribution layer structure.

Figure 22:
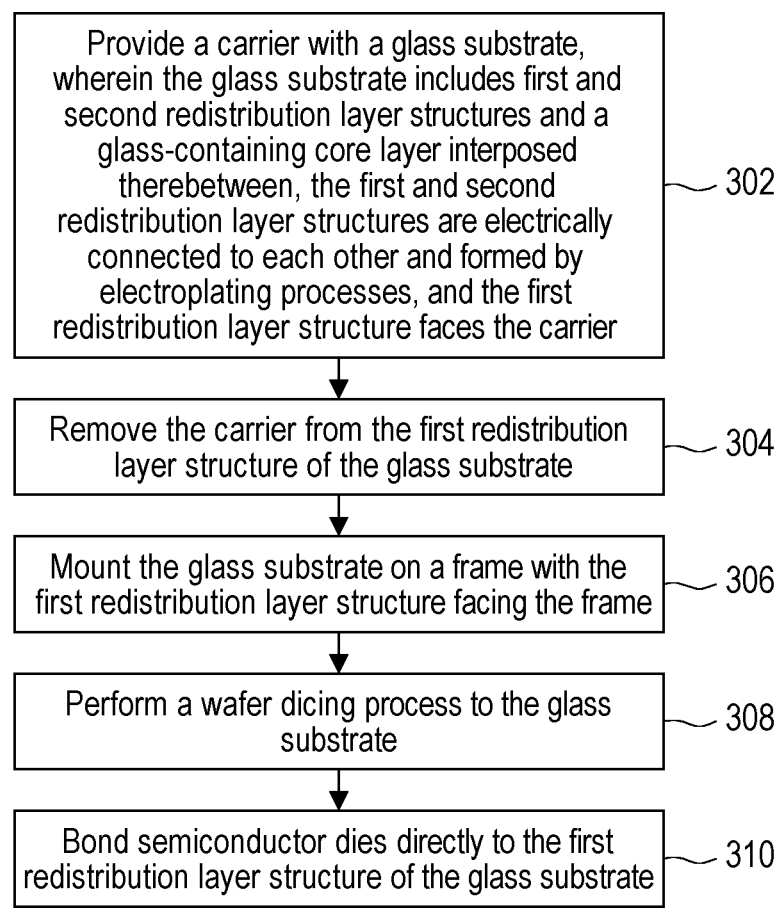
FIG. 22 illustrates a method of forming a semiconductor structure in accordance with some embodiments of the present disclosure.

FIG. 22 illustrates a method of forming a semiconductor structure in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 302, a carrier is provided with a glass substrate formed thereon. FIG. 1 to FIG. 10 illustrate cross-sectional views corresponding to some embodiments of act 302. In some embodiments, the glass substrate includes first and second redistribution layer structures and a glass-containing core layer interposed therebetween, the first and second redistribution layer structures are electrically connected to each other and formed by electroplating processes, and the first redistribution layer structure faces the carrier.

In some embodiments, the glass-containing core layer includes deep vias penetrating therethrough and formed by an electroplating process, as shown in FIG. 1 and FIG. 2. In some embodiments, the glass-containing core layer of the glass substrate includes a quartz layer sandwiched by a first glass layer and a second glass layer, as shown in FIG. 17 and FIG. 18. In some embodiments, the glass-containing core layer of the glass substrate includes a silicon layer sandwiched by a first glass layer and a second glass layer, as shown in FIG. 19 and FIG. 20. In some embodiments, the glass-containing core layer of the glass substrate includes at least one integrated passive device embedded therein, as shown in FIG. 16, FIG. 18 and FIG. 20.

At act 304, the carrier is removed from the first redistribution layer structure of the glass substrate. FIG. 11 to FIG. 12 illustrate cross-sectional views corresponding to some embodiments of act 304.

At act 306, the glass substrate is mounted on a frame with the first redistribution layer structure facing the frame. FIG. 13 illustrates a cross-sectional view corresponding to some embodiments of act 306.

At act 308, a wafer dicing process is performed to the glass substrate. FIG. 14 illustrates a cross-sectional view corresponding to some embodiments of act 308.

At act 310, semiconductor dies are directly bonded to the first redistribution layer structure of the glass substrate. FIG. 15 to FIG. 20 illustrate cross-sectional views corresponding to some embodiments of act 310. In some embodiments, a conventional interposer between the semiconductor dies and the glass substrate is not required, so the total size of the semiconductor package can be significantly reduced.

In the above embodiments, the critical dimension of the first redistribution layer structure is less than (e.g., less than) the critical dimension of the second redistribution layer structure, and the first redistribution layer structure is formed prior to the formation of the second redistribution layer structure. However, the disclosure is not limited thereto. In other embodiments, the first redistribution layer structure with a smaller critical dimension may be formed after the formation of the second redistribution layer structure with a greater critical dimension.

The structures of the disclosure are illustrated below with reference to FIG. 15 to FIG. 20. In some embodiments, a semiconductor structure 1/2/3/4/5/6 includes a glass substrate 10/11/12/13/14/15. The glass substrate 10/11/12/13/14/15 includes a glass-containing core layer 100/101/102, first and second redistribution layer structures 108 and 112 disposed on opposite sides of the glass-containing core layer 100/101/102 and electrically connected to each other through deep vias in the glass-containing core layer 100/101/102, first bumps B1 electrically connected to the first redistribution layer structure 108 of the glass substrate 10/11/12/13/14/15. In some embodiments, the glass-containing core layer 100/101/102 has a thickness of about 1 um or more.

In some embodiments, the glass-containing core layer 100 of the glass substrate 10/11 includes an inorganic layer 100 and through vias DV therein. In some embodiments, each of the through vias DV includes a metal layer and a seed layer surrounding a sidewall of the metal layer.

In some embodiments, the glass-containing core layer 101 of the glass substrate 12/13 includes a quartz layer 101b sandwiched by a first glass layer 101a and a second glass layer 101c, as shown in FIG. 17 to FIG. 18. In some embodiments, the through vias DVb of the quartz layer 101b are electrically connected to the through vias DVa of the first glass layer 101a and the through vias DVc of the second glass layer 101c. In some embodiments, each of the through vias DVa, DVb and DVc includes a metal layer and a seed layer surrounding a sidewall of the metal layer.

In some embodiments, the glass-containing core layer 102 of the glass substrate 14/15 includes a silicon layer 102b sandwiched by a first glass layer 102a and a second glass layer 102b, as shown in FIG. 19 to FIG. 20. In some embodiments, the through vias DVs of the silicon layer 102b are electrically connected to the through vias DVa of the first glass layer 102a and the through vias DVc of the second glass layer 102c. In some embodiments, each of the through vias DVa, DVs and DVc includes a metal layer and a seed layer surrounding a sidewall of the metal layer.

In some embodiments, the glass-containing core layer 100/101/102 of the glass substrate 11/13/15 includes at least one passive device 40 embedded therein, as shown in FIG. 16, FIG. 18 and FIG. 20. The passive device 40 is electrically connected to two lowermost metal features of the redistribution layer structure 108 in some examples.

In some embodiments, the first redistribution layer structure 108 includes a first seed layer SL11 and a first metal feature MF11, and the first seed layer SL11 is disposed between and in contact with one deep via DV and the first metal feature MF11.

In some embodiments, the second redistribution layer structure 112 includes a second seed layer SL21 and a second metal feature MF21, and the second seed layer SL21 is disposed between and in contact with one deep via DV and the second metal feature MF21.

In some embodiments, a critical dimension of the first redistribution layer structure 108 is less than a critical dimension of the second redistribution layer structure 112. For example, the first line width or first via width of the first redistribution layer structure 108 is less than the second line width or second via width of the second redistribution layer structure 112. For example, first bumps B1 (or called "mirco-bumps") of the first redistribution layer structure 108 is less than second bumps B2 of the second redistribution layer structure 112.

In some embodiments, the semiconductor structure 1/2/3/4/5/6 further includes semiconductor dies D21, D22 and D23 electrically connected to the first redistribution layer structure 108 of the glass substrate 10/11/12/13/14/15 through the first bumps B1. Specifically, the semiconductor devices D21, D22 and D23 physically and directly connect the first bumps B1 of the first redistribution layer structure 108 of the glass substrate 10/11/12/13/14/15, without an interposer between the semiconductor devices D21, D22 and D23 and the glass substrate 10/11/12/13/14/15.

In view of the above, the integrated glass substrate of the disclosure can reduce yield loss of heterogeneous integration. Specifically, metal features and polymer layers can be directly formed on glass, so as to reduce the substrate joining process.

Besides, the integrated glass substrate of the disclosure can enhance performance of package. Specifically, glass is a material with lower power/insertion loss and high electrical performance as compared to the conventional silicon and organic core material.

Moreover, the integrated glass substrate of the disclosure provides adjustable CTE property for large size packages. Specifically, the CTE of the integrated glass substrate of the disclosure can be adjusted to match PCB mother board and silicon die.

In addition, the integrated glass substrate of the disclosure is beneficial to reduce cost of system of integrated substrate. Specifically, there is no need to purchase an organic substrate from the vendor, so the production cost of the integrated glass substrate of the disclosure is very competitive.

In accordance with some embodiments of the present disclosure, a method of forming a semiconductor structure includes the following operations. First deep vias are formed in a first glass layer. A first redistribution layer structure is formed on a first side of the first glass layer, and the first redistribution layer structure is electrically connected to the first deep vias. A carrier is bonded to the first redistribution layer structure. The first glass layer is grinded until surfaces of the first deep vias are exposed. A second redistribution layer structure is formed on a second side of the first glass layer opposite to the first side, and the second redistribution layer structure is electrically connected to the first deep vias.

In accordance with alternative embodiments of the present disclosure, a method of forming a semiconductor structure includes the following operations. A carrier is provided with a glass substrate formed thereon, wherein the glass substrate includes first and second redistribution layer structures and a glass-containing core layer interposed therebetween and formed by electroplating processes, the first and second redistribution layer structures are electrically connected to each other, and the first redistribution layer structure faces the carrier. The carrier is removed from the first redistribution layer structure of the glass substrate. The glass substrate is mounted on a frame with the first redistribution layer structure facing the frame. Semiconductor dies are directly bonded to the first redistribution layer structure of the glass substrate.

In accordance with yet alternative embodiments of the present disclosure, a semiconductor structure includes a glass substrate and semiconductor devices. The glass substrate includes a glass core layer, first and second redistribution layer structures disposed on opposite sides of the glass-containing core layer and electrically connected to each other through deep vias in the glass-containing core layer, first bumps electrically connected to the first redistribution layer structure of the glass substrate. The semiconductor devices physically connect the first bumps of the glass substrate.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure, comprising:
   forming first deep vias in a first glass layer;
   forming a first redistribution layer structure on a first side of the first glass layer, the first redistribution layer structure electrically connected to the first deep vias;
   bonding a carrier to the first redistribution layer structure;
   grinding the first glass layer until surfaces of the first deep vias are exposed; and
   forming a second redistribution layer structure on a second side of the first glass layer opposite to the first side, the second redistribution layer structure electrically connected to the first deep vias,
   wherein the method further comprises:
   bonding a silicon layer to the first glass layer, wherein through vias of the silicon layer are electrically connected to the first deep vias of the first glass layer.

2. The method of claim 1, wherein forming the first deep vias comprises:
   forming deep openings in the first glass layer;
   forming a seed layer conformally on sidewalls and bottoms of the deep openings; and
   forming the first deep vias in the deep openings by using the seed layer as a seed.

3. The method of claim 1, further comprising removing the carrier from the first redistribution layer structure.

4. The method of claim 1, further comprising:
   forming first bumps on the first redistribution layer structure before bonding the carrier to the first redistribution layer structure.

5. The method of claim 1, wherein a critical dimension of the first redistribution layer structure is different from a critical dimension of the second redistribution layer structure.

6. The method of claim 1, wherein forming the first redistribution layer structure comprises:
   forming a first seed layer on the first side of the first glass layer;
   forming a first metal feature by using the first seed layer as a seed; and
   forming a first metal via by using the first metal feature as a seed.

7. The method of claim 1, further comprising forming at least one integrated passive device embedded by the first glass layer.

8. The method of claim 7, wherein the at least one integrated passive device comprises a capacitor.

9. The method of claim 1, further comprising:
   bonding a second glass layer to the silicon layer, wherein second deep vias of the second glass layer are electrically connected to the through vias of the silicon layer.

10. A method of forming a semiconductor structure, comprising:
    providing a carrier with a glass substrate formed thereon, wherein the glass substrate comprises first and second redistribution layer structures and a glass-containing core layer interposed therebetween, the first and second redistribution layer structures are electrically connected to each other, and the first redistribution layer structure faces the carrier;
    removing the carrier from the first redistribution layer structure of the glass substrate;
    mounting the glass substrate on a frame with the first redistribution layer structure facing the frame; and
    bonding semiconductor dies directly to the first redistribution layer structure of the glass substrate,
    wherein the glass-containing core layer of the glass substrate comprises a silicon layer sandwiched by a first glass layer and a second glass layer.

11. The method of claim 10, wherein the glass-containing core layer comprises deep vias penetrating therethrough and formed by an electroplating process.

12. The method of claim 10, wherein a sidewall of the silicon layer is substantially flush with a sidewall of the first glass layer or the second glass layer.

13. The method of claim 10, wherein the glass-containing core layer of the glass substrate comprises at least one integrated passive device embedded therein.

14. The method of claim 10, wherein a critical dimension of the first redistribution layer structure is different from a critical dimension of the second redistribution layer structure.

15. A method of forming a semiconductor structure, comprising:
    providing a multi-material core layer;
    forming deep vias through the multi-material core layer;
    forming a first redistribution layer structure on a first side of the multi-material core layer, the first redistribution layer structure electrically connected to the deep vias; and
    forming a second redistribution layer structure on a second side of the multi-material core layer opposite to the first side, the second redistribution layer structure electrically connected to the deep vias,
    wherein the method further comprises forming at least one integrated passive device embedded in the multi-material core layer and electrically connected to the first redistribution layer structure.

16. The method of claim 15, wherein the multi-material core layer comprises a glass layer and a silicon layer adjacent to each other.

17. The method of claim 15, wherein the multi-material core layer comprises a silicon layer sandwiched by a first glass layer and a second glass layer.

18. The method of claim 17, wherein zeroth deep vias in the silicon layer are misaligned with first deep vias in the first glass layer and second deep vias in the second glass layer.

19. The method of claim 15, wherein the at least one integrated passive device comprises a capacitor.

20. The method of claim 15, wherein a critical dimension of the first redistribution layer structure is less than a critical dimension of the second redistribution layer structure.

* * * * *